US012298130B2

(12) United States Patent
Righetti et al.

(10) Patent No.: US 12,298,130 B2
(45) Date of Patent: May 13, 2025

(54) TUNABLE LASER AND METHOD TO TUNE A WAVELENGTH OF A LIGHT EMITTED BY THE LASER

(71) Applicant: POLITECNICO DI MILANO, Milan (IT)

(72) Inventors: Aldo Righetti, Milan (IT); Maria Chiara Ubaldi, Milan (IT); Giorgio Grasso, Monza (IT)

(73) Assignee: POLITECNICO DI MILANO, Milan (IT)

( * ) Notice: Subject to any disclaimer, the term of this patent is extended or adjusted under 35 U.S.C. 154(b) by 746 days.

(21) Appl. No.: 17/599,963

(22) PCT Filed: Apr. 3, 2020

(86) PCT No.: PCT/EP2020/059510
§ 371 (c)(1),
(2) Date: Sep. 29, 2021

(87) PCT Pub. No.: WO2020/201486
PCT Pub. Date: Oct. 8, 2020

(65) Prior Publication Data
US 2022/0011087 A1    Jan. 13, 2022

(30) Foreign Application Priority Data

Apr. 5, 2019  (IT) .................... 1020190000005264

(51) Int. Cl.
*H01S 3/106*    (2006.01)
*G01B 9/02004*  (2022.01)
*G01B 9/02091*  (2022.01)

(52) U.S. Cl.
CPC ..... *G01B 9/02004* (2013.01); *G01B 9/02091* (2013.01); *H01S 3/1065* (2013.01)

(58) Field of Classification Search
CPC ................. H01S 3/1065; H01S 3/1062; H01S 5/14–148; G02F 1/13–1398; G02F 1/216; G01B 9/02004; G01B 9/02091
See application file for complete search history.

(56) References Cited

U.S. PATENT DOCUMENTS 6,545,739 B1 *  4/2003  Matsumoto ........ G02B 6/29358
                                                          349/198
2014/0031678 A1 *  1/2014  Yamada ................ H01S 3/1068
                                                          600/425

(Continued)

OTHER PUBLICATIONS

Li et al. "Enhanced nanosecond electro-optic effect in isotropic and nematic phases of dielectrically negative nematics doped by strongly polar additive". Journal of Molecular Liquids 267 (2018) pp. 450-455. (Year: 2018).*

(Continued)

*Primary Examiner* — Xinning(Tom) Niu
*Assistant Examiner* — Delma R Forde
(74) *Attorney, Agent, or Firm* — FISHERBROYLES, LLP; Roger L. Browdy; James E. Mrose

(57) ABSTRACT

The present invention relates to a method to tune a wavelength of a coherent light signal emitted by a tunable laser, the tunable laser comprising:
  a cavity, the cavity including:
    a gain medium,
    an optical tunable filter,
    a first and a second mirrors, one of which is partially reflective,
  wherein the optical tunable filter includes:
    a first and a second electrodes,
    a liquid crystal,
  the method comprising:
  applying a voltage difference between the first and second electrodes to apply an electric field to the liquid crystal;
    wherein applying a voltage difference includes:

(Continued)

applying the voltage difference for at least a driving time interval lasting less than 1 μs; and varying the voltage difference applied between the first and second electrodes within the driving time interval so that a maximum applied voltage difference is reached and said maximum applied voltage is above 0.1 kV.

19 Claims, 18 Drawing Sheets

(56) References Cited

U.S. PATENT DOCUMENTS

| | | | |
|---|---|---|---|
| 2016/0018679 A1 | 1/2016 | Shiyanovskii et al. | |
| 2016/0085095 A1* | 3/2016 | Chien | C09K 19/0275 445/24 |

OTHER PUBLICATIONS

I. Abdulhalim, "Non-display bio-optic applications of liquid crystals", Liquid Crystals Today, GB, (Apr. 6, 2011), vol. 20, No. 2, doi:10.1080/1358314X.2011.563975, ISSN 1358-314X, pp. 44-60, XP055421544 [A] 1,2 * p. 52, col. r, paragraph 2—p. 56, col. I, paragraph 1; figures 12,13.

Jeroen Beeckman, "Liquid-crystal photonic applications", Optical Engineering., Bellingham, (Aug. 1, 2011), vol. 50, No. 8, doi:10.1117/1.3565046, ISSN 0091-3286, p. 081202, XP055650535 [A] 1-20 * https://www.spiedigitallibrary.org/journals/optical-engineering/volume50/issue-8/081202/Liquid-crystal-photonic-applications/10.1117/1.3565046.short.

V. Borshchs.V. Shiyanovskiio.D. Lavrentovich, "Nanosecond Electro-Optic Switching of a Liquid Crystal," Physical Review Letters, PRL 111, 107802 (2013), Sep. 6, 2013, American Physical Society, 107802-1 through 107802-5.

V. Borshchs.V. Shiyanovskiib.-X. Lio.D. Lavrentovich, "Nanosecond electro-optics of a nematic liquid crystal with negative dielectric anisotropy" Physical Review E, (20140000), vol. 90, p. 062504 https://link.aps.org/accepted/10.1103/PhysRevE.90.062504.

Bing-Xiang Li, Volodymyr Borshch, Sergij V. Shiyanovskii, Shao-Bin Liu, and Oleg D. Lavrentovich , "Electro-optic switching of dielectrically negative nematic through nanosecond electric modification of order parameter", Appl. Phys. Lett. 104, 201105 (2014) https://doi.org/10.1063/1.4879018.

Bing-Xiang Lia et al., (Mar. 2015) "Nanosecond electric modification of order parameter in nematic and isotropic phases of materials with negative and positive dielectric anisotropy", Proc. SPIE 9384, Emerging Liquid Crystal Technologies X, 93840U (Mar. 11, 2015); doi: 10.1117/12.2076657 https://www.spiedigitallibrary.org/search?term=93840U.

Kanwar, Anita. (2013). "Measurement of order parameter, birefringence and polarizibility of liquid crystals" Journal of Optics. 42. 10.1007/s12596-013-0141-1.

* cited by examiner

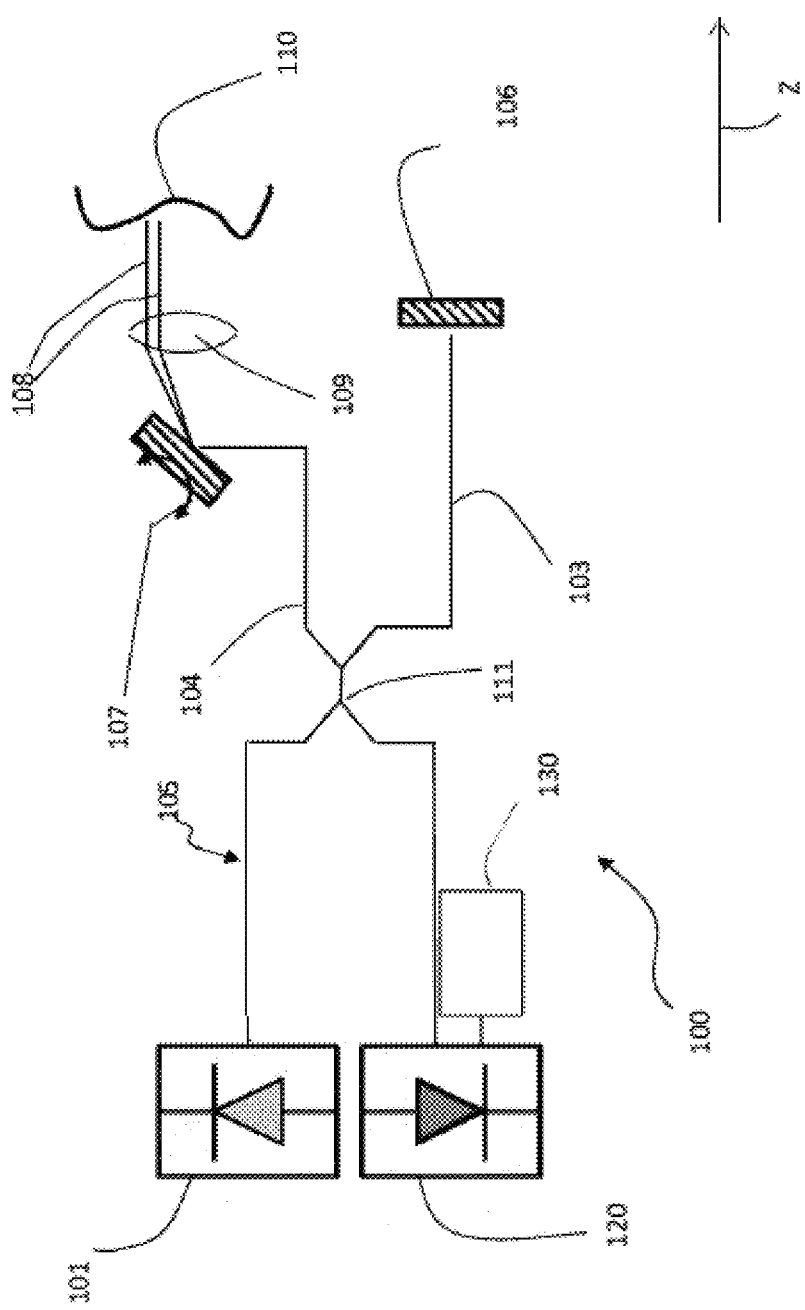

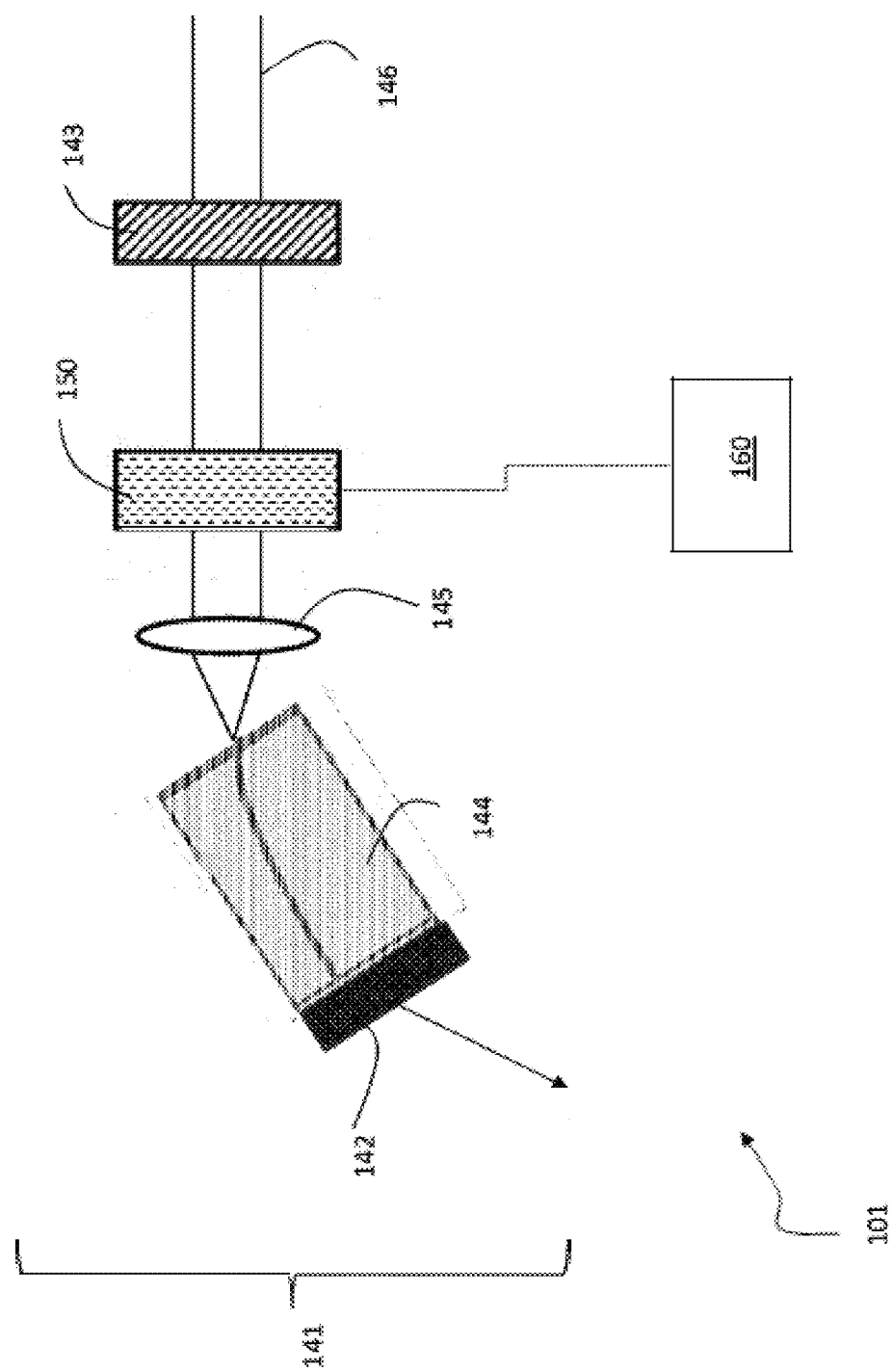

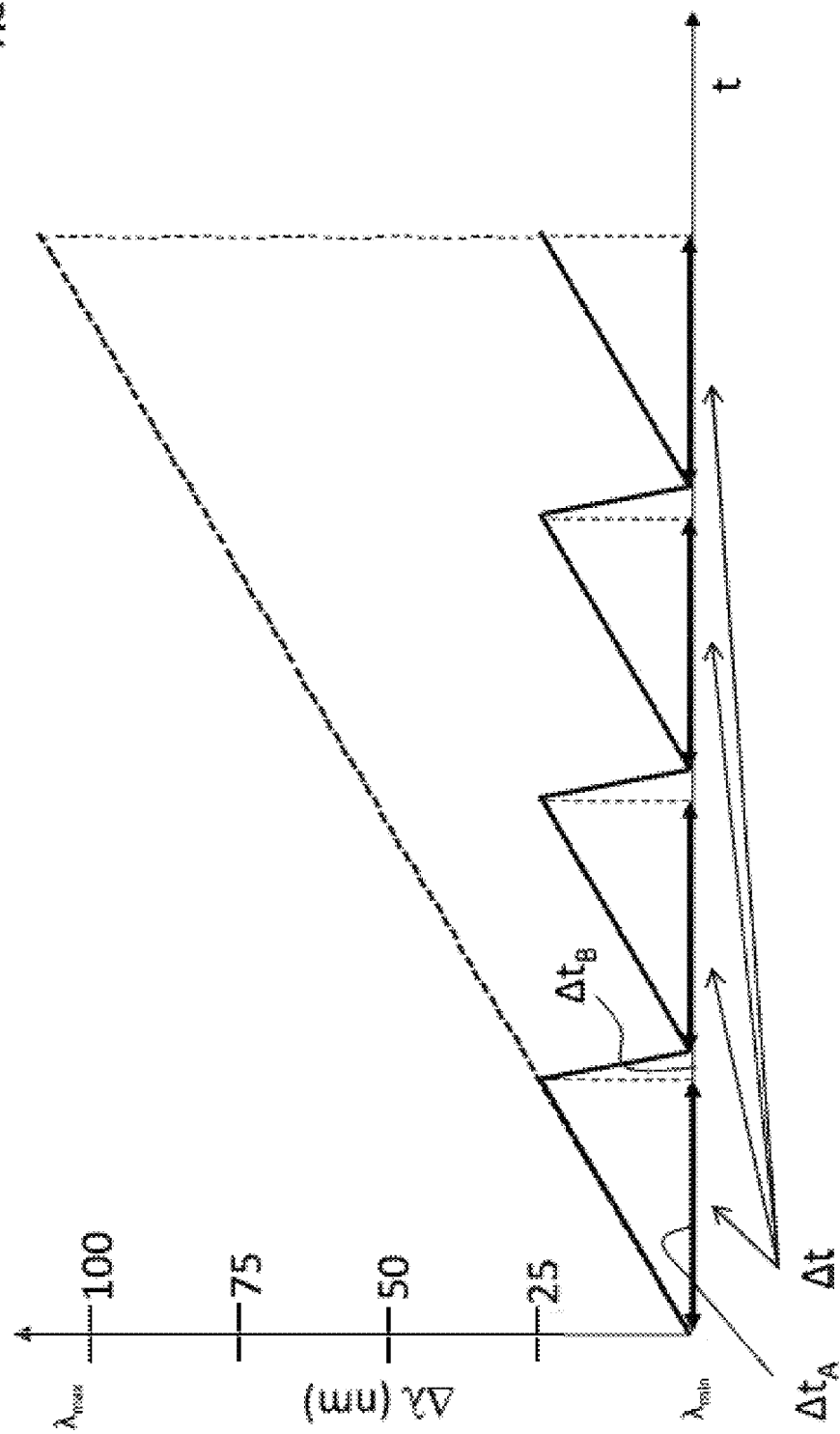

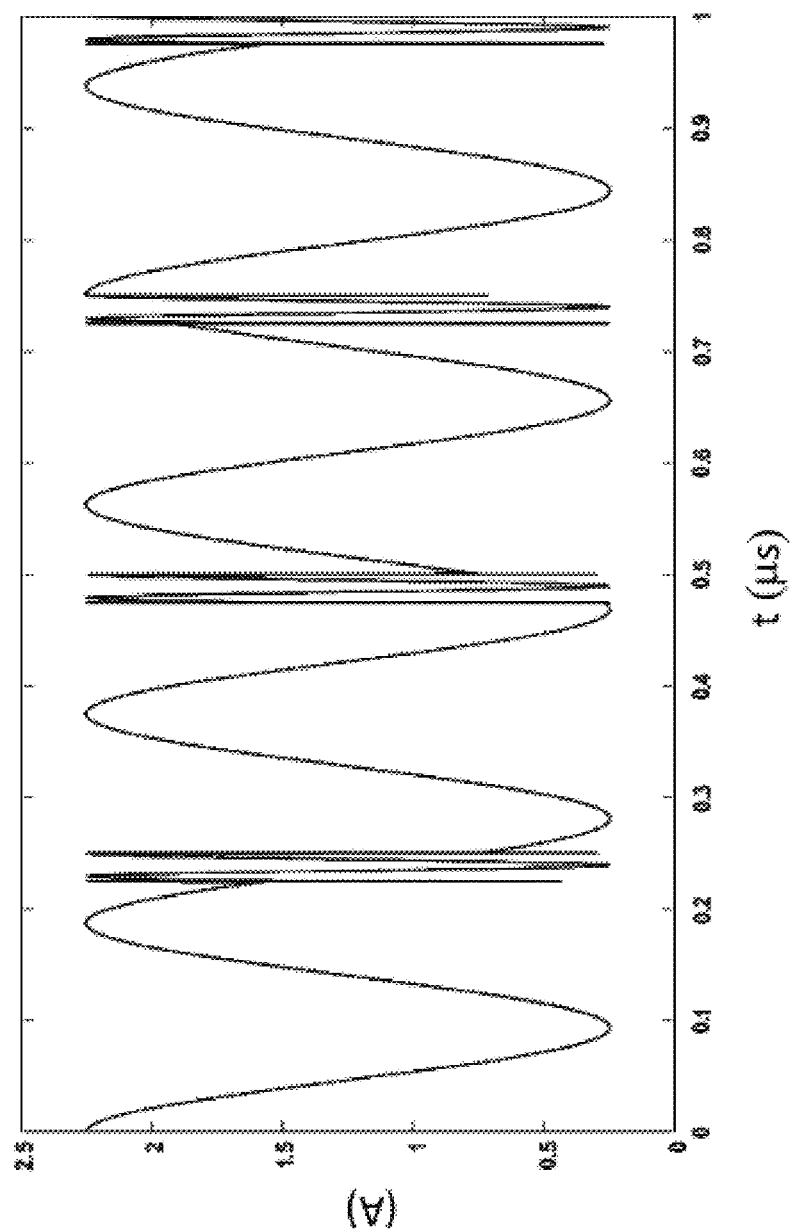

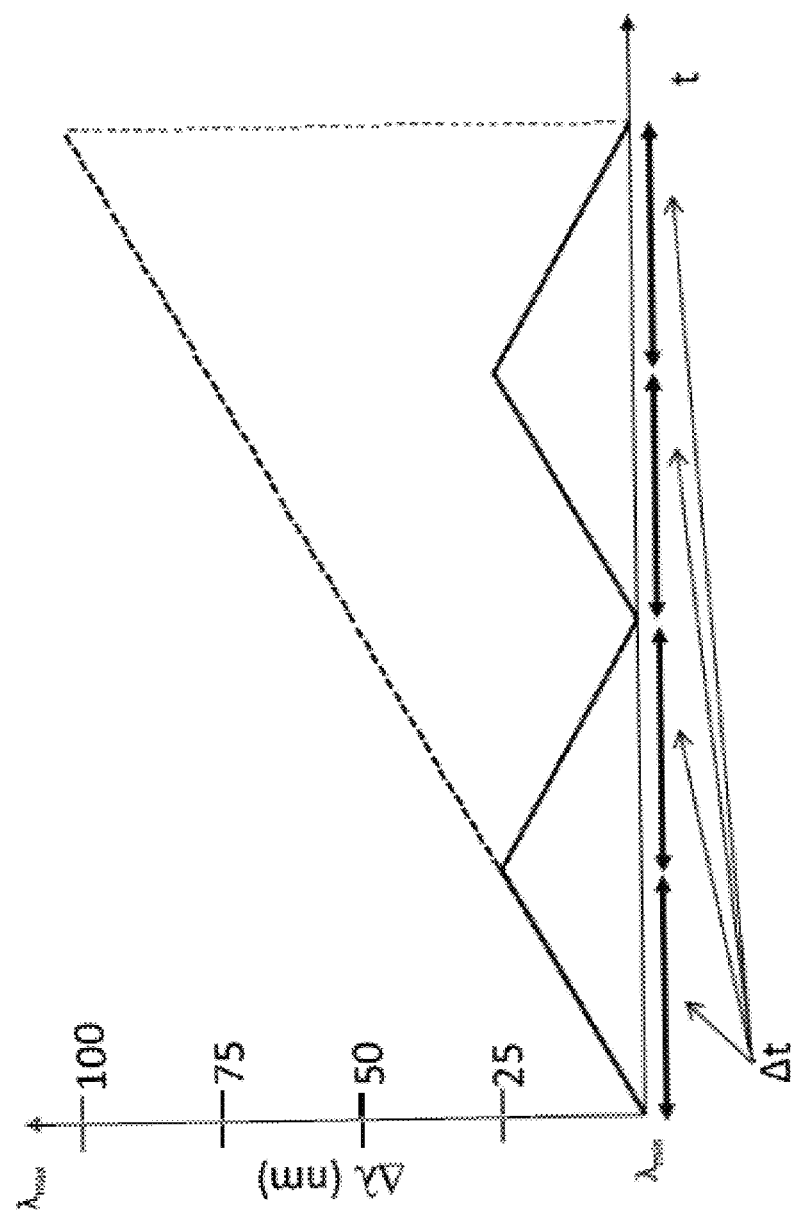

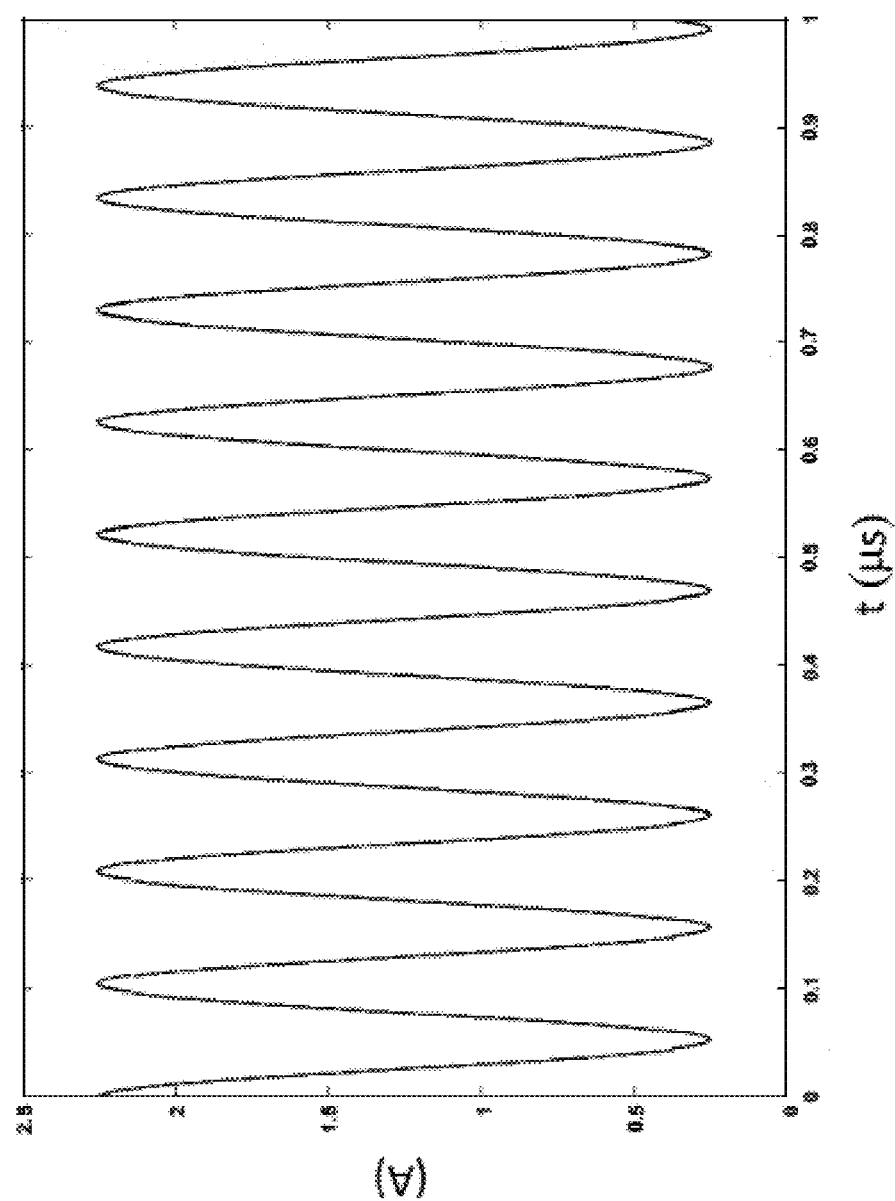

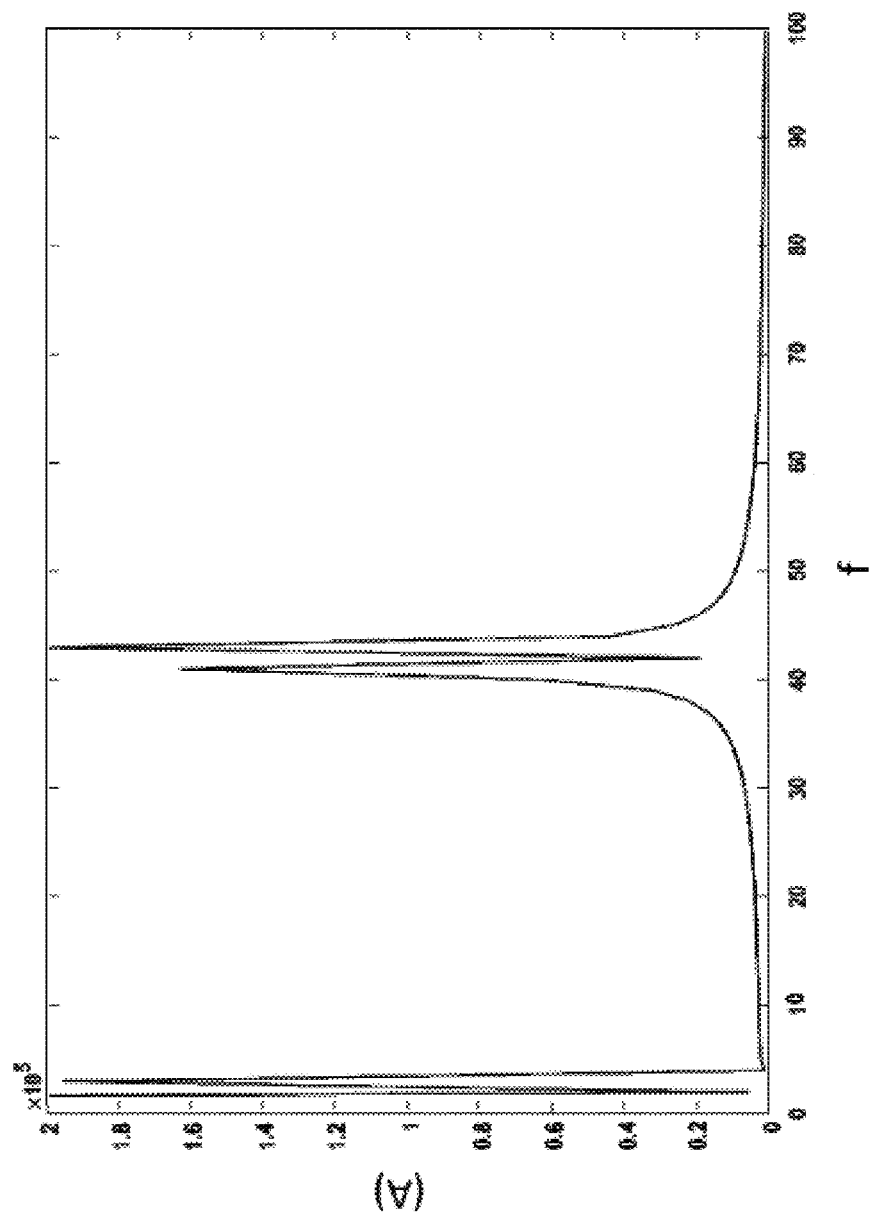

TUNABLE LASER AND METHOD TO TUNE A WAVELENGTH OF A LIGHT EMITTED BY THE LASER

CROSS-REFERENCE TO RELATED APPLICATIONS

This application is a § 371 national stage entry of International Application No. PCT/EP2020/059510, filed Apr. 3, 2020, which claims priority to Italian Patent Application No. 102019000005264, filed Apr. 5, 2019, the entire contents of which are incorporated herein by reference.

TECHNICAL FIELD

The present invention relates to a tunable laser, preferably but not necessarily used for optical coherence tomography (OCT), and a method to tune the same. The laser has a very fast response, that is, the tuning speed is relatively high when compared to other tunable lasers.

TECHNOLOGICAL BACKGROUND

A tunable laser is a laser whose wavelength of operation can be altered in a controlled manner. While substantially all laser gain media allow small shifts in output wavelength, only a few types of lasers allow continuous tuning over a significant wavelength range.

There are many types and categories of tunable lasers. They exist in the gas, liquid, and solid state. Tunable lasers find applications for example in spectroscopy, photochemistry, atomic vapor laser isotope separation, and optical communications.

Tunable lasers can use different technology in order to obtain the tuning. Sample Grating Distributed Bragg Reflector lasers, for example, have a relatively larger tunable range. Other technologies to achieve wide tuning ranges are for example: external cavity lasers using a MEMS structure for tuning the cavity length or using multiple-prism grating arrangements. Alternatively, in order to achieve a given tunable range, DFB laser arrays based on several thermal tuned DFB lasers: Coarse tuning is achieved by selecting the correct laser bar and the fine tuning is done thermally. Another option is tunable VCSEL: one of the two mirror stacks is movable.

For some applications, however, it is not only necessary that the laser can be tuned within a given bandwidth, but also that the tuning is performed in a relatively fast manner.

One of these applications is for example optical coherence tomography (OCT) that uses coherent light to capture two and three dimensional images of samples, in particular when a non-destructive testing of the sample is needed, such as in medical tissues.

The functional principle behind OCT imaging is light interference. In an OCT system, the light beam from a source, for example a laser source, is split into two paths by a coupler directing the split light along two different arms of an interferometer. One arm is generally named reference arm, while the other is named the sample arm. When the light exits the end of either arms, it is shaped by various optical components (mirror, lenses, etc.) to control specific beam parameters such as shape, depth of focus and light intensity distribution. In the reference arm, the light is back reflected by a reference mirror (or any other reflecting surface) and it returns into the interference system, propagating along the same path it came from but in the opposite direction. The same process happens with the light in the sample arm, though in this case the light exiting the arm is backscattered by the sample. In an inhomogeneous sample, different structures within the sample will have different indices of refraction and light will be backscattered when it encounters an interface between materials of different refractive index. The returning lights from both arms recombine, for example at a coupler, and generate an interference pattern, which is recorded by a detector.

It is to be understood that in the present application the term "light" is used in the general sense of "electromagnetic radiation" and it is not limited to radiation in the visible range.

The sample can be any object and the direction of propagation of the light illuminating the sample defines the direction of "depth" of the sample, or Z, while a plane perpendicular to it defines a (X,Y) plane. The scope of OCT is, by means of a (X,Y) scan, to acquire information on the depth of the sample, i.e. information on the sample in the Z direction, which is the direction of propagation of the light beam emitted from the source.

For a particular position of the reference mirror, the light propagating in the reference arm travels a certain optical distance and forms the corresponding interference pattern only with light that has travelled the same optical distance along the sample arm, including the portion of the distance travelled inside the sample. Therefore, when the reference mirror is translated along the propagating direction of light, for different positions of the mirror, the returning reference generates interference patterns with light backscattered from corresponding depths within the sample. In this way, the dependence on depth of backscattered light intensity from beneath the sample surface can be measured.

The OCT signal recorded by the detector during a complete travel of the reference mirror is called a depth scan or A-scan. In order to form an OCT image, the sample beam has to be translated across the sample surface with an A-scan being recorded in each position of the beam. Therefore, a set of consecutive A-scans is obtained from an OCT image or otherwise called B-scan (i.e. set of consecutive A-scans along the X direction). The 3D combination of all A scans and B scans along the Y direction, is called C-scan.

In the scanning above described, there are two main OCT technologies, time-domain OCT and Fourier domain OCT (also called frequency domain OCT). The latter is further divided in spectral-domain OCT (SD-OCT) and swept-source OCT (SS-OCT). SS-OCT uses a broadband source that scans the sample in a controlled way with a narrow spectral line across the available bandwidth of the source. As a main difference from before, the reference mirror is fixed, i.e. it does not move. The movements of the mirror are "replaced" by the wavelength changes of the light source. As before, however, the reference beam is reflected from the now fixed mirror and forms an interference pattern with the light backscattered by the sample that is subsequently detected by a point detector. Because of the way the source is scanned across the available bandwidth, the output is a wavenumber-dependent photo-current that is recorded by the point detector simultaneously with the scanning of the narrow band source. The quantity of interest, the A-scan, is obtained performing the Fourier transform of the detected signal over one sweep of the source over the available broadband. That is, in SS-OCT, the OCT signal recorded by the detector during a complete sweeping of the source in its broadband is called a depth scan or an A-scan. The definition of B and C scans remains unchanged. Since the light from a swept source consists of a source signal with a continuously changing wavelength over time, the coherence length of the scanned laser determines the maximum imaging depth of the system while the wavelength range over which the laser is swept determines the axial resolution of the system. Therefore, a scanning laser with a narrow line width enables a deeper probing depth while a wider sweep range produces OCT images with higher axial resolution.

Due to the fact that SS-OCT systems may also be used to detect images of portions of living bodies, for example of the eye, it is also of importance to generate OCT images in real time, for example to avoid problems related to eye's movements or to be able to perform a 3D imaging of a tissue portion also during a surgical procedure. For example, an OCT image having a scan of 200×200 pixels with a repetition rate of 25 frames per second requires a million sweeping scans per second. In SS-OCT technology, it is therefore important to have a source where generated light beam wavelength can vary as fast as possible.

More in detail, as mentioned, the SS-OCT uses an interferometer. The interference signal obtained, which is a beat signal, has a given frequency. Assuming that the source linearly varies its wavelength (or frequency), then the frequency of the beat signal is determined by the relative delay between the reference signal coming from the reference arm and the signal coming from the sample, thus it depends from the distance between the two surfaces reflecting the two signals exiting the two arms. If $\Delta f$ is the speed of the source oscillation frequency variation, its frequency can be written:

$$F = F_0 + (\Delta f)t$$

where $F_0$ is the initial frequency and t is the time elapsed from the beginning of the scan. The frequency of oscillation which is detected by the detector of the beat signal (or interference signal) is thus:

$$F_{beat} = F(t) - F(t-\tau) = (\Delta f)T$$

where T is the time delay between the optical signals from the two arms in the interferometer which is in turn equal to $$T = \frac{zn}{c}$$

where z is the difference in path, c is speed of light and n the refraction index encountered along the light path. The two arms of the interferometer have substantially equal length, thus the length difference z is mainly due to the difference in path caused by the optical signal propagation in the sample.

After the interference signal has been received, it is elaborated, a Fourier transform might for example be performed and the elaborated detected frequencies indicate the depth of the reflecting surfaces of the sample.

If the beat signal from a single reflection related to a specific frequency or wavelength of the optical signal from the source is detected for a time Ts and the source is supposed to have a constant emission power, its Fourier transform can be written as $$S(F) = \sin[(F*Ts)/Ts*F]$$

Thus the depth (or z) resolution of the OCT system depends on the smallest detectable difference between two beat frequencies which, in this case, can be defined as the width of the function sin(x)/x at the first node of the Fourier transform. Without being bound by theory, it results that the depth resolution is equal to $$\Delta Z = \frac{c}{2n(Ts)(\Delta f)} \quad (1)$$

where $(\Delta f)(Ts)$ is the total variation of frequency underwent by the light emitted by the source during a single sweeping. For example, for a spatial z resolution of about 10 µm, the $(\Delta f)(Ts)$ product (or bandwidth of the source) is about 100 nm.

The single reflection refers to a discontinuity point in the sample that may reflect or diffuse the light and is preferably visualized. It might belong to the surface of the sample. Certain samples might have more than a reflection point for each wavelength, depending on the structure of the sample itself. For example, in case of an eye as sample, for each wavelength and A scan, more than a reflection is generally detected. Each reflection point, belonging to a reflecting surface in a different z position, gives rise to a different beat frequency.

From the calculation above, it is clear that the source to be used in the OCT system needs to be tunable in a wide range, at the same time it also preferably needs to operate in a monomodal regime in the whole required range. Furthermore, the wide tuning has to be performed in a very short time interval to allow the system to be used for example also in the medical field.

Sources used in the SS-OCT systems comprised in the prior art are for example tunable laser sources. The tunable laser sources have been mentioned above. These sources may comprise lasers which may include an optical gain medium, such as a semiconductor junction, coupled with a cavity having a variable length, such as VCSEL cavity operated by MEMS. Alternatively, a fixed-length cavity can be used, including an optical filter having a tunable band, such as an external cavity laser having an Etalon filter. The sweeping speed depends on the speed of the movable element (in case of MEMS) or the optical filter tuning. Optical movable elements may limit the sweeping speed due to their mechanical inertia and thus generally an optical filter without movable parts is preferred. Optical filters, on the other hand, such as Etalon filters, having such a wide Free Spectral Range (around 100 nm for example) tunable in a very fast time range require the use of ultrafast electro-optic materials such as Lithium niobate, or very special optical crystals. These materials anyhow have small electro-optical coefficients and thus allow small variations of the refractive index.

SUMMARY OF THE INVENTION

The present invention relates to a tunable laser, a method to tune the wavelength of a coherent light signal emitted by a laser, an OCT imaging system and an optical OCT analysis method, in particular for SS-OCT, in which the laser source is tunable in a fast and reliable way and at the same time it provides a bandwidth or free spectral range which is wide enough for many applications, such as most OCT applications.

Further, a goal of the invention is to provide a laser source and a method to tune the wavelength of a coherent light signal emitted by a laser, an OCT imaging system and an optical OCT analysis method, and in particular for SS-OCT, in which the laser source does not include movable part in order to achieve tunability and is relatively easy to fabricate.

Liquid crystal lasers are known. A liquid-crystal laser is a laser that uses a liquid crystal as the resonator cavity, allowing selection of emission wavelength and polarization from the active laser medium. The lasing medium is usually a dye doped into the liquid crystal.

Starting with a liquid crystal in the nematic phase, the preferably desired helical pitch (the distance along the helical axis for one complete rotation of the nematic plane subunits) can be achieved by doping the liquid crystal with a chiral molecule. For light circularly polarized with the same handedness, this regular modulation of the refractive index yields selective reflection of the wavelength given by the helical pitch, allowing the liquid-crystal laser to serve as its own resonator cavity. Tuning of the output wavelength is achieved by smoothly varying the helical pitch: as the winding changes, so does the length scale of the crystal. This in turn shifts the band edge and changes the optical path length in the lasing cavity. Applying a static electric field perpendicular to the dipole moment of the local nematic phase rotates the rod-like so subunits in the hexagonal plane and reorders the chiral phase, winding or unwinding the helical pitch.

In such liquid crystal lasers, however, the realignment of the molecules (i.e. of their optic axes) is too slow for some applications. The change in refractive index of the liquid crystal, and thus of the wavelength of the light emitted by the laser, is relatively slow.

As a matter of fact, for applications requiring a fast wavelength variation of the light emitted by a laser, liquid crystals are generally not considered as suitable materials due to the aforementioned slowness of the refractive index variations, other materials being preferred, materials which exhibit a fast and significant electro-optic effect, for example Lithium Niobate, InP or other semiconductors.

In this context "fast" means an effect having a response time of the order of 10 ns or even faster, and "significant" means that the related liquid crystal refractive index change achievable is greater than 0.01. On the other hand, the term "slow" is herein construed as an effect having a typical response time of the order of a millisecond, such as for example the thermal and/or electrical driven reorientation of the molecular axis of the liquid crystal molecules.

Generally speaking, some liquid crystals might have a fast electro-optic effect, the latter however does not generate a significant refractive index change and for this reason liquid crystals are not generally known as materials suitable for applications requiring a fast wavelength variation of the light emitted by a laser. However, recently, a new effect, an electro-optic effect, has been discovered in liquid crystals, as detailed for example in V. Borshch, S. V. Shiyanovskii, O. D. Lavrentovich, Phys. Rev. Lett. 111 (2013) 107802; V. Borshch, S. V. Shiyanovskii, B.-X. Li, O. D. Lavrentovich, Physical Review E 90 (2014) 062504; B.-X. Li, V. Borshch, S. V. Shiyanovskii, S.-B. Liu, O. D. Lavrentovich, Appl. Phys. Lett. 104 (2014) 201105. This fast effect is called NEMOP (Nanosecond Electroptic Modification of an Order Parameter) and can generate a significant refractive index change of the liquid crystals.

An electric field can induce or modify optical birefringence in both the isotropic and nematic phases of liquid crystals. In the isotropic phase, the electric field induces birefringence with an optical axis along the field. In the nematic, the change of existing birefringence through nanosecond electric modification of order parameters (NEMOP) that does not require realignment of the optic axis has been discovered. In the present invention, use of this effect is made to fabricate a tunable laser with a very fast tunability.

Applicants have realized that exploiting classic electro-optic phenomenon which is related to Frederik's effect, i.e. reorientation of molecule director n in low frequency electric field caused by anisotropy of dielectric susceptibility, is not fast enough for the preferred uses. In the Frederick's effect, the electric field applied in the same direction of the director n forces the director to rotate perpendicularly to E. This effect can be indeed relatively fast (hundreds of ns) when the electric field is switched on, but slow when the electric field applied to the liquid crystal is switched off, due to NLC elastic behavior (time of tens of ms).

In order to get ultrafast response both in field on and field off switching phase (tens of ns), Applicants have found that they can exploit the NEMOP effect (Nanosecond Electrically induced Modification of Order Parameters) of the liquid crystal as a tunable optical filter of a laser.

The Applicants have understood that NEMOP effect can be conveniently exploited by applying a voltage difference to the liquid crystal for a driving time shorter than 1 microsecond, since relatively "slow" effects causing the liquid crystal refractive index changes are prevented or reduced. The same also holds in the case of multiple repeated applications of a voltage difference for a plurality of driving times (shorter than 1 microsecond)

According to an aspect, the invention relates to a tunable laser comprising a cavity.

Preferably, the cavity includes a gain medium.

Preferably, the cavity includes an optical tunable filter.

Preferably, the cavity includes a first and a second mirrors, one of which is partially reflective.

Preferably, the optical tunable filter includes a first and a second electrodes.

Preferably, the optical tunable filter includes a liquid crystal.

Preferably, the liquid crystal is subject to an electric field created by the first and second electrodes.

Preferably, the tunable laser comprises a voltage generator to apply a voltage difference between the first and second electrodes.

Preferably, the voltage generator is programmed for applying the voltage difference for at least a driving time interval lasting less than 1 µs.

Preferably, the voltage generator is programmed for varying the voltage difference applied between the first and second electrodes within the driving time interval so that a maximum applied voltage difference is reached and said maximum applied voltage is above 0.1 kV.

According to a second aspect, the invention relates to an Optical Coherence Tomography (OCT) system including the tunable laser according to the first aspect emitting a coherent light signal.

Preferably, the OCT system includes an optical interferometer for dividing the coherent light signal into a reference arm leading to a reference reflector and a sample arm leading to a sample.

Preferably, the OCT system includes an optical element to selectively direct a sample light signal exiting the sample arm to a specific portion of the sample, so that for each selection in the optical element a different specific portion of the sample is illuminated.

Preferably, the OCT system includes an optical detector for detecting an interference signal generated by a combination of reference and sample returning signals from the reference arm and from the sample arm, reflected by the reference reflector and the sample, respectively.

According to a third aspect, the invention relates to a method to tune a wavelength of a coherent light signal emitted by a tunable laser, the tunable laser comprising a cavity.

Preferably, the cavity includes a gain medium.

Preferably, the cavity includes an optical tunable filter.

Preferably, the cavity includes a first and a second mirrors, one of which is partially reflective.

Preferably, the optical tunable filter includes a first and a second electrodes.

Preferably, the optical tunable filter includes a liquid crystal.

Preferably, the method comprises applying a voltage difference between the first and second electrodes to apply an electric field to the liquid crystal.

Preferably, applying a voltage difference includes applying the voltage difference for at least a driving time interval lasting less than 1 µs.

Preferably, applying a voltage difference includes varying the voltage difference applied between the first and second electrodes within the driving time interval so that a maximum applied voltage difference is reached and said maximum applied voltage is above 0.1 kV.

According to a fourth aspect, the invention relates to an optical coherence tomography analysis method comprising: providing an Optical Coherence Tomography system according to the second aspect.

Preferably, the method comprises sweeping the tunable laser for a time interval ΔT, so that a wavelength of the coherent light signal leading to the sample light signal illuminating the specific portion of the sample changes from a minimum wavelength to a maximum wavelength.

Preferably, said sweeping includes: applying a voltage difference to the electrodes to apply an electric field to the liquid crystal.

Preferably, applying a voltage difference includes applying the voltage difference for at least a driving time interval lasting less than 1 µs.

Preferably, applying a voltage difference includes varying the voltage difference applied between the first and second electrodes within the driving time interval so that a maximum applied voltage difference is reached and said maximum applied voltage is above 0.1 kV.

Preferably, the method comprises detecting the interference signal generated by the sweeping.

Preferably, the method comprises elaborating the detected interference signal generated by the sweeping to obtain an OCT image of the specific portion of the sample.

In the tunable laser of the invention, the liquid crystal is preferably the tunable element that allows the wavelength change of the coherent light source emitted by the laser itself.

The used liquid crystal (LC) can include many types of liquid crystal materials, with positive or negative anisotropy, and a certain degree of order, related to their phase (nematic, smectic, columnar, bent-core, blue-phase).

A variable S of the liquid crystal can be defined as follow.

Order in the liquid crystal can be approximated by the following:

$$s = \left(\frac{3(\cos\theta)^2 - 1}{2}\right)$$

where θ is the angle of any possible molecule and the average director.

The ideal maximum order degree is where θ is zero, so S=1. Most of real cases of molecular arrangement exhibit a degree of order between 0.3 and 0.9: for a nematic phase S is between 0.7 and 0.4 (this near to transition to isotropic phase, after transition is 0). Order is generally a function of temperature, increasing if lowering temperature from clearing one (transition temperature to isotropic phase).

The preferred liquid crystal used in the present invention are those having an S value comprised between 0.3 and 0.8. How the value S is defined and measured can be found for example in "Nanosecond electric modification of order parameter in nematic and isotropic phases of materials with negative and positive dielectric anisotropy", written by Bing-Xiang Lia et al., Emerging Liquid Crystal Technologies X, edited by Liang-Chy Chien, Harry J. Coles, Hirotsugu Kikuchi, Ivan I. Smalyukh, Proc. of SPIE Vol. 9384, 93840U•© 2015 SPIE and in "Measurement of order parameter, birefringence and polarizibility of liquid crystals", written by Anita Kanwar, J. Optics available online at the following Digital Object Identifier (D.O.I.), DOI: 10.1007/s12596-013-0141-1.

The liquid crystal used in the laser is preferably a liquid crystal having a NEMOP response. Thus, the liquid crystal used has preferably a high electro-optic coefficient. An electro-optic efficiency can be defined as $$\frac{\Delta n}{E},$$

which is the ration between the variation in refractive index and the applied electric field. The liquid crystal used in the invention have preferably the electro-optic efficiency higher than 30 pm/V. Further, the selected liquid crystal have a fast response to the electric field. The time in which they modify their refractive index at the application of an electric field is <1 µs.

The laser source has a cavity. The cavity is limited by mirrors. Preferably, one of the mirrors is a partially reflective mirror and the other is a high reflectivity mirror. The cavity includes a gain medium and an optical tunable filter. The optical tunable filter preferably includes the liquid crystal as above specified.

As known, for the gain medium to amplify light, it needs to be supplied with via pumping. The energy is typically supplied as an electric current or as light at a different wavelength. Light from the gain medium bounces back and forth between the mirrors, passing through the gain medium and being amplified each time. The light also passes through the tunable optical filter. The partially transparent mirror allows some of the light to escape through it. Therefore, depending on the characteristics of the optical filter, for example its refractive index, the wavelength of the light which escapes the cavity through the partially transparent mirror may vary. Changing the characteristics of the tunable optical filter changes the wavelength of the light outputted by the laser.

The optical filter of the invention has a given bandwidth or free spectral range, e.g. it can be tuned from a minimum to a maximum value of refractive index (or vice-versa) by applying an electromagnetic field to it.

The tuning of the wavelength of the output of the laser, i.e. the wavelength of a coherent light signal, thus depends on the refractive index of the tunable optical filter. The effect used in the present invention to obtain a variation of the wavelength of the Liquid Crystal in the tunable optical filter in the cavity of the laser source is preferably the NEMOP effect (Nanosecond Electrically Induced Modification of Order Parameters of the liquid crystal).

In the NEMOP effect, the electric field is applied to the liquid crystal perpendicularly to the director n, so as to avoid its reorientation; only the components of the optic tensor are changed:

$$\tilde{\varepsilon}_x = \tilde{\varepsilon}_\perp + \delta\tilde{\varepsilon}_x; \tilde{\varepsilon}_y = \tilde{\varepsilon}_\perp + \delta\tilde{\varepsilon}_y; \tilde{\varepsilon}_z = \tilde{\varepsilon}_\parallel + \delta\tilde{\varepsilon}_z.$$

The liquid crystal can be any type carrying a positive or negative dielectric and magnetic anisotropy. Preferably, the tunable optical filter is an etalon (also named Fabry-Pérot filter).

Further, in order to obtain a reasonable bandwidth, the liquid crystal is preferably doped. The liquid crystal is preferably doped with a polar additive, that is, with polar molecules, preferably with strongly polar molecules. Alternatively or in addition, the LC material may include various additives, for example, but not limited to: nanoparticles, polymer networks forming polymer-stabilized systems, e.g., polymer-dispersed liquid crystal (PDLC), polymer-stabilized liquid crystal (PSLC), LC in porous media, LC doped with metal, polymer, dielectric, organic and inorganic nano and submicron particles.

The tuning of the liquid crystal is thus performed by applying an external electromagnetic field across the liquid crystal via electrodes. For this purpose, a first and a second electrode sandwich the liquid crystal, forming a cell.

A variation in the applied electromagnetic field causes a variation in the refractive index of the liquid crystal and thus a variation of the wavelength of the coherent light signal emitted by the laser.

For example, in order to obtain a linear tunability, the signal generator energizes the electrodes which apply a driving voltage to the liquid crystal in the optical filter. Varying the voltage difference linearly, the refractive difference index of the LC is varied linearly as well changing the transmission characteristic of the Fabry-Perot filter.

The voltage difference is applied for a short time frame. That is, the voltage difference is applied for a driving time interval having a given duration to the electrodes so that also the generated electromagnetic field is applied to the liquid crystal for a short time interval. The voltage difference applied includes at least such an "on" period, that is, the voltage difference is applied at least for a driving time interval lasting less than 1 μs.

The driving time interval has preferably a duration comprised between 1 ns and 1 μs. More preferably, the driving time interval has a duration comprised between 10 and 500 ns. More preferably, the driving time interval has a duration comprised between 10 and 100 ns.

Therefore, the voltage difference is applied for at least one driving time interval. Preferably, it is applied for more than one driving time interval. The one or more driving time interval, all last less than 1 μs.

This voltage difference, in order to tune the wavelength, within a single driving time interval, is also varied in order to obtain, still within the same driving time interval, a variation of the wavelength of the coherent light signal emitted by the laser. Within the tuning, relatively high value of voltages difference between the electrodes are achieved.

The driving voltage difference is preferably above 0.1 kV, more preferably above 0.2 kV, more preferably comprised between 0.2 kV and 10 kV, more preferably comprised between 0.5 kV and 5 kV, even more preferably comprised between 1 kV and 2 kV.

This applied driving voltage difference between the two electrodes creates an electromagnetic field of the order of $10^8$ V/m at the liquid crystal. This electromagnetic field, additionally applied to a relatively narrow cell, is relatively high and could cause damages to the cell itself if applied for too long. Therefore, preferably, the voltage between the two electrodes is not applied continuously, but in short driving time intervals.

Further preferably, the voltage difference is applied in "short" driving time intervals, i.e. shorter or equal to 1 μs. Within this very short driving time interval, a variation of the applied voltage difference takes place which leads to a tuning of the wavelength of the signal emitted by the laser. This is possible because the NEMOP response is very fast. The standard response of the liquid crystals, i.e. the reorientations of molecules, would be too slow to react to the application of this voltage. However, the NEMOP response, being of the order of ns, is fast enough to follow the effect of such fast-driving time interval voltage difference.

The Applicants have understood that by applying a voltage difference to the liquid crystal for a driving time shorter than 1 microsecond, relatively "slow" effects causing the liquid crystal refractive index changes are so prevented or reduced. This holds also in the case of multiple repeated applications of a voltage difference for a plurality of driving times (shorter than 1 microsecond), provided said plurality of driving times are generated with a repetition rate comprised between 100 KHz and 100 MHz, which corresponds to a repetition time comprised between 0.01 milliseconds and 0.01 microseconds.

The term "slow" is herein construed as an effect having a typical response time of the order of a millisecond, such as for example the thermal and/or electrical driven reorientation of the molecular axis of the liquid crystal molecules.

Hence, those slow effects can cause a strong liquid crystal refractive index changes (Δn>0.1) when driven to a maximum frequency of 10 KHz. On the other hand, the refractive index change caused by those "slow" effects decrease when the driving frequency exceeds 10 kHz. In particular, when the voltage difference is applied to the liquid crystal for a driving time shorter than 1 microsecond, the contribution to the liquid crystal refractive index change of any "slow" effect is lower or even much lower than the liquid crystal refractive index change due to the NEMOP effect, which can be as large as to produce a liquid crystal refractive index reversible change Δn greater than 0.01 (at about 0.5 KV of driving voltage difference).

Again, this holds also in the case of a multiple repeated applications of a voltage difference for a plurality of driving times (each of them shorter than 1 microsecond), provided said plurality of driving times are generated with a repetition rate comprised between 100 KHz and 100 MHz.

Repetition rates even higher than 100 MHz, i.e. in the GHz range or higher, can be also envisaged with a suitable doping of the liquid crystal.

The external electro-magnetic field is preferably applied in switch-on and switch-off configurations. For example, the electromagnetic field is applied to the liquid crystal (LC) for a given time interval and it is switched off. Alternatively, it can be varied quickly. Typical raise and fall times of the electromagnetic field in this on/off behavior are of about 5-10 ns. It is to be noted that the liquid crystal response due to NEMOP effect shows very fast response time, typically much lower than 100 ns.

The electrodes are connected to a signal generator so that a signal can be applied to the electrodes to generate an electromagnetic field. Such signal has been described above.

The OCT system and method of the invention are used to obtain an OCT scan of a sample. The sample could be a portion of the human body or any other desired element, transparent to the employed wavelength range of the signal emitted by a light source.

In the SS-OCT system of the invention, a laser source is used. The laser source can emit a coherent light signal having a wavelength which can be varied within a given bandwidth. This laser can be for example a tunable laser. The tunable laser has a bandwidth AA.

In the SS-OCT system, the coherent light from the laser is split in two by means of an interferometer. The two arms of the interferometers are called sample and reference arms. Thus a portion of the split light signal travels in the sample arm and exits the same, generating the sample light signal. The sample light signal exiting the sample arm illuminates a portion of the sample. In order to select which portion of the sample is to be illuminated in order to obtain an A-scan of the same, an optical element is provided to move the coherent light coming from the sample arm to different portions of the sample. According to given parameters, the optical element can selectively illuminate with the sample light signal coming from the sample arm a portion of the sample. This illuminated portion changes, i.e. another portion of the sample is selected, when the optical element moves the sample light signal on the sample. The illumination of two different portions of the sample may partially overlap, i.e. two selections may lead to an illumination of two different portions of the sample which are not completely spatially distinct. An A-scan corresponds to each selection by the optical element of a portion of the sample, e.g. an A-scan is an OCT image of a portion of the sample selected by the optical element. Thus an Ascan is obtained for the same selection in the optical element.

This selection of a portion of the sample by the optical element may be done mechanically, for example considering the optical element as comprising a turning mirror that can direct the sample light signal coming from the sample arm towards a specific portion of the sample. The sample light signal can be oriented moving, e.g. rotating, the mirror itself, for example along X or Y direction, both perpendicular to the propagating direction of the sample light signal coming out of the sample arm, till the desired portion of the sample is illuminated.

Alternatively, the sample light signal coming out the sample arm may be moved on the sample to select a desired portion using an acousto-optic device, and therefore the portion of the sample to be illuminated may be selected changing a voltage or current value fed to the optical element. Any optical device apt to change the position of a sample light signal over a sample can be used as optical element as well.

The second arm of the interferometer, the reference arm, has a function as in standard SS-OCT system and outputs a reference light signal towards a reference reflector.

The sample and the reflector reflect light back into the two arms of the interferometer generating a sample returning signal and a reference returning signal, respectively.

Selected a portion of the sample to be illuminated, a sweeping of the light source is performed, that is, a tuning of the wavelength of the coherent light signal emitted by the source is performed, where the wavelength of the coherent light signal is changed within to for a sweeping time $\Delta T$. The sweeping is performed keeping fixed—i.e. keeping always in the same position—the beam of the sample light signal coming out of the sample arm, i.e. always impinging the same selected portion of sample for the whole sweeping duration. This sweeping corresponds to the generation of a single A-scan. During the interval $\Delta T$, the light emitted by the source changes its wavelength from a minimum to a maximum. The minimum and maximum are given by the bandwidth of the laser source, given by the optical filter containing the LC.

The tuning of the LC due to the NEMOP effect is very fast and particularly suitable for the OCT application.

In the above mentioned first, second, third or fourth aspect, the invention may include the following characteristics, either in combination or as alternatives.

Preferably, applying a voltage difference includes applying the voltage difference for at least a driving time interval lasting between 1 ns and 1 µs. Preferably, applying a voltage difference includes applying the voltage difference for at least one driving time interval, the at least one driving time interval lasting between 1 ns and 1 µs.

Although the NEMOP effect is "fast", there is a response time limit also when using this phenomenon. Therefore, preferably, the voltage difference is applied to the electrodes for longer than 1 ns, preferably for longer than 5 ns.

Preferably, the liquid crystal comprises or is a nematic liquid crystal.

Preferably, the liquid crystal or the nematic liquid crystal is doped with a polar additive.

Preferably, varying the voltage difference applied to the first and second electrodes within a driving time interval includes varying the voltage difference between a minimum and a maximum.

Thus, the value of 0.1 kV is preferably included between this minimum and this maximum.

Preferably, varying the voltage difference applied to the first and second electrodes within a driving time interval includes varying the voltage difference linearly with time.

In the tuning of the wavelength, the variation of it over time can be linear. In order to obtain a linear variation of the wavelength, a linear variation of the electric field applied to the LC is performed.

Preferably, varying the voltage difference applied to the first and second electrodes within a driving time interval includes: varying the voltage difference from a minimum value to a maximum value; and varying the voltage difference from the maximum value to the minimum value afterwards.

The variations can be in both directions, either increasing or decreasing the wavelength outputted by the laser. A triangle-wave behaviour of the wavelength over time is obtained. If the speed at which the applied voltage difference is increased and the speed at which the applied voltage difference is decreased is substantially the same, then the result in the variation of the wavelength over time is a curve which resembles a triangle isosceles.

Preferably, varying the voltage applied to the first and second electrodes within a driving time interval includes: varying the voltage difference between a minimum value to a maximum value; and interrupting the voltage difference application.

Preferably, in a following application of a voltage difference to the electrodes, the applied voltage is so that the following step takes place: varying the voltage between the minimum value to the maximum value after the interruption.

Preferably, varying the voltage applied to the first and second electrodes within a driving time interval includes:

varying the voltage difference from a minimum value to a maximum value; and interrupting the voltage difference application.

Preferably, in a following application of a voltage difference to the electrodes, the applied voltage is so that the following step takes place: varying the voltage from the minimum value to the maximum value after the interruption.

A sawtooth-like wave is obtained.

Preferably, the applied voltage difference has a repetition rate comprised between 100 kHz and 100 Mhz. Preferably, applying varying the voltage applied to the first and second electrodes within a driving time interval includes: applying a voltage difference to the first and second electrodes with a repetition rate comprised between 100 kHz and 100 Mhz.

Preferably, the voltage difference is not applied to the first and second electrodes only once for a driving time interval shorter than 1 μs, but for several driving time intervals, all shorter than 1 μs. The driving time intervals can have all the same duration or different durations.

Preferably, the optical tunable filter further comprises a first and a second high reflectivity dielectric layer sandwiching the liquid crystal.

Preferably, the high reflectivity layer is a high reflectivity dielectric layer, thus the optical tunable filter further comprises a first and a second high reflectivity dielectric layer sandwiching the liquid crystal.

More preferably, the first and/or second high reflectivity layer defines a reflectivity, the reflectivity being above or equal to 95%.

The reflectivity of the high reflectivity layer is preferably greater than 95% in order to ensure a narrow line width output of the signal from the cavity. For the OCT application, a linewidth of 0.6 nm in generally preferred because it may lead, for a typical etalon geometry, to a reflectivity greater than 95%, preferably greater than 97%.

Preferably, the high reflectivity layer is a multilayer.

Preferably, the high reflectivity dielectric layer has a thickness comprised between 1 μm and 10 μm.

Preferably, the thickness is comprised between 1 μm and 6 μm. This value includes the thickness of the whole layer on both sides of the liquid crystal.

Preferably, the liquid crystal defines a liquid crystal thickness, and wherein the distance between the first and second electrode is comprised between 10 micron and 200 micron.

Preferably, the high reflectivity layers are interposed between the electrodes and the liquid crystal. Alternatively, the electrodes are interposed between the high reflectivity layers and the liquid crystal.

For example, the liquid crystal in the laser of the invention fills a gap between two optically transparent slabs (preferably glass), wherein said gap has a width which is narrower than 100 urn, preferably narrower than 50 μm, even more preferably narrower than 30 μm. On the other hand, the width of the gap is preferably wider than 10 μm. In general, the narrower the width of the gap between two optically transparent slabs, the broader the Free Spectra Range of the resulting tuneable filter. At the same time, the gap has preferably a minimum width, so that the liquid crystal can be sandwiched between said two optically transparent slabs, filling the gap.

According to an embodiment, the liquid crystal is applied by centrifugation on an optically transparent slab (preferably glass) and then confined by another optically transparent slab (preferably glass). Further preferably, the transparent slabs are interposed between outer electrodes and the latter are interposed between outer glass layers.

The typical LC thickness range in order to obtain laser source tunability in the desired range, for example in a range wider than 20 nm, is preferably between 10 and 50 microns, more preferably between 15 and 40 microns, even more preferably between 20 and 30 microns. The thickness of the cell is substantially the thickness of the liquid crystal because the thickness of the dielectric multilayer is relatively small, with respect to that of the high reflectivity layers.

According to an embodiment, the cell comprises, from top to bottom (top and bottom are used to describe a succession of layers, the physical orientation of the cell can be arbitrary): quartz or glass substrate, a layer of Indium Tin Oxide (ITO) conductive and transparent to the wavelengths travelling in the cavity (this define the electrode), a dielectric multilayer having a high reflectivity and including two layers, a low refractive index one (e.g. $SiO_2$) and a high refractive index one (e.g. $TiO_2$), the liquid crystal and then again dielectric multilayer, ITO and glass or quartz substrate. The position of the electrode and the multilayer can be exchanged to modify the reflectivity in the wavelength range of interest.

Preferably, the polar addictive has a negative dielectric anisotropy.

Nematic liquid crystal without additive may show a limited variation in refractive index. A non-mesogenic additive, for example 2, 3-dicyano-4-pentyloxyphenyl 4'-pentyloxybenzoate (DPP) with a large transverse dipole moment to mesogenic materials in order to enhance their negative dielectric anisotropy can be added. The DPP doping substantially increases the field-induced birefringence in both NEMOP and Kerr effects, up to 0.02. The doping also slows down the switching processes, but this effect can be compensated by rising working temperatures, if necessary.

Preferably, the first and the second electrodes are at least partially transparent to a radiation having a given wavelength resonating in the cavity.

The liquid crystal is positioned between two electrodes, for example thin films of low resistivity, high transparency TCO (transparent conductive oxide) material. These conductive layers preferably face one another inside the cell and are separated by a suitable gap filled up by the chosen material. The cell may be sealed by means of a gasket containing size-controlled microparticles to ensure uniform distance. Further, the highly reflective dielectric multilayer is preferably deposited on top of at least one, preferably on top of each, of the TCO to ensure a Fabry Perot behavior. It is to be understood that the meaning of "on top" is equal to "in contact with a surface of", being the orientation of the liquid crystal cell arbitrary.

According to an embodiment, the cell comprises, from inner layers to outer layers, the liquid crystal or the nematic liquid crystal interposed between $TiO_2/SiO_2$ glass slabs forming the high reflectivity multilayer, the high reflectivity multilayer being interposed between a pair of electrodes, the pair of electrodes being interposed between a pair of glass layers.

Preferably, the $TiO_2/SiO_2$ glass slabs have no electro-optical properties.

Preferably, the first mirror is partially reflective and the second mirror is substantially totally reflective; the first mirror defines a mirror free spectral range and the optical tunable filter defines an filter free spectral range; and the mirror free spectral range is of the same order of magnitude of the same order of magnitude of the filter free spectral range.

More preferably, the filter free spectral range and/or the mirror free spectral range is >20 nm.

Due to the fact that the wavelength of the light in the cavity varies because the optical filter can be tuned, also the partially transparent mirror has preferably a given free spectral range. Preferably, the free spectral range of the partially transparent mirror is the same or substantially the same of the free spectral range of the optical filter. In this way, the linearity of the output of the laser source can be obtained and the simultaneous lasing at two or more wavelengths is substantially prevented. Preferably the free spectral range of the mirror and/or of the optical tunable filter is narrower than 40 nm, more preferably narrower than 30 nm, more preferably wider than 20 nm.

Preferably, the OCT system further includes a processing unit, said processing unit being programmed for, for the same selection in the optical element illuminating a specific portion of the sample, defining a sweeping time interval $\Delta T$.

Preferably, the OCT system further includes a processing unit, said processing unit being programmed for, for the same selection in the optical element illuminating a specific portion of the sample, changing the coherent light signal leading to the sample light signal illuminating the specific portion of the sample from a minimum wavelength to a maximum wavelength and in the same sweeping modifying the wavelength of the coherent light signal so that it reaches the same value between the minimum wavelength to the maximum wavelength at least twice during the sweeping.

Preferably, the OCT system further includes a processing unit, said processing unit being programmed for, for the same selection in the optical element illuminating a specific portion of the sample, elaborating the detected interference signal for obtaining an OCT image of the specific portion of the sample.

As shown in FIG. 1 and from the equation (1) above, it has been shown that in order to have the required depth resolution in a limited amount of time (a quick sweeping time), the variation in wavelength of the light emitted by the source in such short amount of time should be rather broad, i.e. of about or greater than 100 nm. This considerably limits the number of available light sources or requires the use of a very expensive or complex one.

Applicants have noticed that the delay times of the light signals coming from the interferometers have a magnitude of fractions of nanoseconds, while the overall sweeping time for each A-scan is of the order of hundreds of nanoseconds, so there are three orders of magnitude of difference. Furthermore, Applicants have noticed that, for the detected interference signals, positive or negative frequencies difference have the same "effect". The interference signal, in other words, does not depend on the absolute oscillation frequency, but depends on the (small with respect to the overall sweeping duration) delay between the signals coming back from the sample and the reference and travelling in the two arms of the interferometer, and on the speed in which the frequency (or wavelength) change in time.

Applicants have therefore realized that it is not necessary to increase the wavelength of the light emitted by the laser source continuously during the whole sweeping time. Given a sweeping time $\Delta T$, in which a single A-scan is obtained, the wavelength of the light emitted by the source of the OCT system does not need to increase from a minimum which is obtained at $t=0$ to a maximum obtained at $t=\Delta T$, as generally assumed in the prior art. The sweeping time $\Delta T$ could be divided in sub-intervals, or sub-sweeping times, in each of which the wavelength of the signal emitted by the source might increase or decrease between a minimum and a maximum. This maximum can be smaller, even much smaller, than the maximum wavelength that in a linear regime, i.e. such as in FIG. 1, is to be achieved in order to obtain the desired resolution in depth.

Having a sweeping time in which the source changes its wavelength not only monotonously allows to use in a SS-OCT system light sources which have a more limited wavelength range of variation than what is required in the prior art, without penalizing the time to obtain the overall scan and the image quality (resolution).

In the present invention, during the sweeping, the wavelength of the coherent light signal is changed, but it is not always increasing as depicted in FIG. 1. In the present invention, the sweeping time $\Delta T$ is divided in several sub-intervals, at least two sub-intervals (more in general, N sub-intervals). In each of these sweeping sub-intervals, all belonging to the same sweeping, that is, all concurring to the realization of the same A-scan (i.e. all concurring to the formation of an OCT image of the same portion of the sample in depth), the so wavelength of the coherent light signal is varied, preferably—but not necessarily—linearly.

In each sub-interval, the wavelength A of the light source signal is varied, within the range defined by the overall minimum and maximum (but not necessarily reaching them), in such a way that the wavelength of the coherent light signal at one instant within the $(i+M)_{th}$ sub-interval (where i and M are integers) has the same value which it had at a different instant during the $i_{th}$ sub-interval, that is:

$\lambda$ in the $i_{th}$ subinterval at time $t_1=\lambda$ in the $(i+M)_{th}$ sub-interval at time $t_2$ There could be many "points" (e.g. instants of time or even time intervals) when the light source signal has the same wavelength both in the $i_{th}$ and in the $(i+M)_{th}$ sub-interval. Additionally, if there are N>2 sub sweeping intervals, there might be an instant in the first sub-interval when the wavelength of the coherent light signal is identical to the wavelength of the coherent light signal at an instant in the second sub-interval which is also identical to the wavelength of the coherent light signal at an instant in the third interval and so on, e.g.:

$\lambda$ in the $i_{th}$ sub-interval at time $t_1, t_2, t_3 \ldots =\lambda$ in the (i+M)-th sub-interval at time $t_k, t_{k+1}, t_{k+2} \ldots =\lambda$ A in the (i+M+L)-th sub-interval at time $t_m, t_{m+1}, t_{m+2} \ldots$ where M, l, k, m and L are integers.

The sweeping is thus divided in sub-sweepings, for example in N sub intervals, in which the wavelength of the coherent light signal has a given behaviour. The duration $\Delta t_i$ of each sub sweeping interval, where i=1 ... N integer, is such that $\Sigma_1^N \Delta t_i=\Delta T$.

In this way, the width of the range in which the wavelength of the light source signal has to be tuned can be smaller than in the situation of FIG. 1, but the same result is achieved in term of speed and resolution. The wavelength variation of the coherent light signal emitted by the source is divided in "sub variations" each requiring a smaller range. This does not affect the resolution of the system, as detailed below.

It is to be underlined that the light source in the SS-OCT system is a single light source performing the sweeping in the manner above outlined. In other words, the sweeping including the sub-intervals is generated by a single laser source, the wavelength of which is modulated in each sweeping sub-interval.

This coherent light signal as mentioned travels in the interferometers and generates the reference light signal and sample light signal exiting the sample reference and sample arm. These two signals, in turn, are reflected by the reference reflector and the sample, respectively, generating a reference and sample returning signals travelling back in the reference arm and the sample arm.

The two returning signals generate an interference signal, or beat signal, which is detected. The detector can be for example a photodetector. This interference signal which is detected includes the interference signal also generated by the sample light signals generated by the at least two coherent light signals coming from the laser source and impinging the sample and having the same wavelength.

The fact that the sweeping interval is divided in sub intervals, having a temporal duration of $\Delta t_i$, without a constant increase of the wavelength of the coherent light signal in the whole sweeping interval having a duration of $\Delta T$ as previously defined, does not affect the resolution of the final image, because for the interference signal only the difference in path between the interfering signals is relevant, not the absolute value of the wavelengths. Without being bound by theory, it can be said that only the absolute value of the wavelength difference matters in generating the interference signal.

The A-scan for the selected portion of the sample illuminated for the duration of the sweeping is obtained using both the coherent light signals within the same sweeping and having the same wavelength, and in particular the interference signal (or beat signal) generated by both the corresponding sample returning signal of the two coherent light signal having the same wavelength is used to obtain the A-scan. It is to be understood that the same wavelength of the coherent light signals is present when the two light signals are emitted (at different times) at the source. is, when "light signals having the same wavelength" means "light signals that have the same wavelength when they are emitted by the light source", e.g. just outputted.

In the above mentioned first and second aspect, the invention may include the following characteristics, either in combination or as alternatives.

Preferably, sweeping the source for a time interval $\Delta T$, includes dividing the sweeping in N, where N sub-sweeping interval, wherein in each sub-sweeping interval, for a portion thereof, the wavelength of the coherent light signal varies with time substantially identically to the previous sub-sweeping step or varies with time opposite to the previous sub-sweeping step.

The detected interference signal generated by the sweeping, in all the N sub-sweeping intervals, is used to obtain the same A scan. Thus the same A scan may include interference signal generated by using the sample returning signals of several coherent light signals all having the same wavelength.

The sweeping in the sub-interval is performed all for the same selection in the optical element.

The coherent light signal, as said, in each sub-sweeping interval, portion of the total sweeping time $\Delta T$, may vary from a minimum to a maximum independently from the previous or subsequent sub-sweeping interval, as long as there are at least two points (e.g. time instants) during the whole sweeping time where the coherent light signal reaches the same wavelength value. Preferably, for a portion of each sub-sweeping interval, the coherent light signal wavelength has the same behaviour with respect to time, i.e. it has the same values, which are reached in the previous or subsequent sub-sweeping interval. For example, if f(t) is the value of the wavelength of the coherent light signal as a function of the time, there is preferably a first time interval $\Delta t_i$ belonging to the i-th sub-sweeping interval and a second time interval $\Delta t_{i+1}$ belonging to the (i+1)-th sub-sweeping interval for which $$f(t) \text{ for } t \in \Delta t_i = \pm f(t) + C \text{ for } t \in \Delta t_{i+1}$$

where C is a constant and i+1≤N. The meaning of the equation is that for all instants t within time interval $\Delta t_i$ belonging to the i-th sub-sweeping interval, the behaviour of the wavelength over time is substantially identical, or opposite, to the behaviour of the wavelength over time for all instants t within time interval $\Delta t_{i+1}$ belonging to the (i+1)-th sub-sweeping interval, apart from a constant C.

In other words, the wavelength in the $i_{th}$ sub-sweeping interval defines a curve function of time. A portion of this curve is reproduced in the subsequent (i+1)-th sub-sweeping interval, or its opposite (i.e. the opposite of the function, $-f(t)$). The constant C may vary in each sub sweeping interval.

The identity in f(t) is of course not a mathematical identity. The emission of a wavelength and the tuning of the signal are bound to tolerances of the apparatuses used and therefore the "identity" is within the above mentioned tolerances. These tolerances are preferably <20% for each point of the curve, preferably <10%, more preferably <5%, even more preferably <2%.

Applicants have realized that "positive" or "negative" frequencies' differences substantially lead to the same result when the interference signal is then processed, e.g. the beat signals stay unchanged regardless of whether the coherent light signal increases its wavelength or decreases it (in substantially the same way). In other words, the detected interference signal remains unchanged if the wavelength variation is substantially inverted. Only the absolute value of the wavelength difference may matter in generating the interference signal.

Preferably, elaborating the detected interference signal involves excluding a region of the above-mentioned signal corresponding to the time when the N−1 sub-sweeping interval ends and the N sub-sweeping interval starts.

Around the time when the wavelength behaviour as a function of time changes, for example from an increasing behaviour to a decreasing behaviour, the resulting interference signal might be not usable to obtain a proper OCT image. Those times, or also the neighbourhood of these times, of "behaviour changes" might be removed from the overall interference signal and not elaborated further.

Preferably these portions which are deleted from the detected interference signal correspond to regions where the wavelength of the coherent light signal is at about its maximum or at about its minimum.

Preferably, all sub-sweeping intervals have identical sub-sweeping duration $\Delta t \leq \Delta T/2$.

The total sweeping duration $\Delta T$ is preferably divided in N sub sweeping interval all having the same duration $\Delta t$, so that $\Sigma_1^N \Delta t_i = N\Delta t = \Delta T$. Due to the fact that the overall time of the sweeping phase is fixed and depends on the application, the duration of the sub sweeping intervals determines the number N of intervals. Preferably N is not too big in order to avoid to remove many portions of the detected interference signal.

Preferably, the behaviour of the wavelength of the coherent light signal over time in each sub sweeping signal is the same, i.e. the wavelength behaviour over time is substantially periodical with period $\Delta t$.

Preferably, sweeping the swept source for a time interval $\Delta T$ includes sweeping the swept source for a time interval shorter than 10 μs, more preferably shorter than 1 μs. More preferably, $\Delta T$ is shorter than 100 ns.

$\Delta T$, the duration of an A-scan, is preferably very "quick". However, in order to obtain an acceptable resolution in Z of the OCT image, and at the same time having a scan which is fast enough, preferably the time allotted for each sweeping is in the above claimed range.

The sub-sweeping intervals are preferably shorter than 50 ns each. More preferably, they are longer than $\Delta T/6$. More preferably, they are shorter than $\Delta T/2$.

Preferably, the method includes: dividing the sweeping in N, where N≥2, sub-sweeping interval, providing the (i−1)-th sub-sweeping interval having a duration $\Delta t_{i-1}$ with the wavelength of the coherent light signal having the following behaviour:

1$\lambda_{i-1}(t)$=f(t) where f(t) is a monotone function between $t_1$ and $t_2$, where $t_1$ and $t_2 \in \Delta t_{i-1}$; and providing the i-th sub-sweeping interval having a duration $\Delta t_i$ with the wavelength of the coherent light signal having the following behaviour:

$\lambda_i(t)$=−f(t)+C where C is a constant, between $t_3$ and $t_4$ where $t_3$ and $t_4 \in \Delta t_i$.

Alternatively, the method includes: dividing the sweeping in N, where N≥2, sub-sweeping interval, providing the (i−1)-th sub-sweeping interval having a duration $\Delta t_{i-1}$ with the wavelength of the coherent light signal having the following behaviour:

$\lambda_{i-1}(t)$=f(t) where f(t) is a monotone function between $t_1$ and $t_2$, where $t_1$ and $t_2 \in \Delta t_{i-1}$; and providing the i-th sub-sweeping interval having a duration $\Delta t_i$ with the wavelength of the coherent light signal having the following behaviour:

$\lambda_i(t)$=f(t)+C where C is a constant, between $t_3$ and $t_4$ where $t_3$ and $t_4 \in \Delta t_i$.

Therefore, in this embodiment, the behaviour of the wavelength over time in two adjacent sub-sweeping interval is the same (f(t) is the same in both interval). C might also be equal to zero.

Preferably, for at least a portion of each sub sweeping interval, the wavelength behaviour over time is a monotonous function of time. Thus, depicting the wavelength as a curve function of time, each sub sweeping interval includes a portion of the same curve, or its opposite, "shifted in time", which is monotone for a time interval. Preferably, this monotone portion of curve is present in all sub sweeping intervals. $\lambda_{i-1}(t)$ indicates the value of the wavelength of the coherent light source in the interval i−1, while $\lambda_i(t)$ indicates the value of the wavelength of the coherent light source in the interval i, where i is an integer and i=1 . . . N.

More preferably, all sub sweeping intervals have equal sub sweeping duration $\Delta t$ and $\lambda_{i-1}(t)=\lambda_i(t)+C$ where C is a constant for the whole duration of the sub sweeping interval.

Alternatively, all sub sweeping intervals have equal sub sweeping duration $\Delta t$ and $\lambda_{i-1}(t)=-\lambda_i(t)+C$ where C is a constant for the whole duration of the sub sweeping interval.

Preferably, the behaviour of the wavelength in all sub sweeping intervals is the same, or its opposite. Again, the definition of "the same" or "identical" refers to an identity within the above mentioned tolerances intrinsic of the apparatus. The same behaviour of the wavelength considered as a curve in a sub sweeping interval is copied and shifted in time to the next sub sweeping interval, or it is copied, the opposite is made, and then shifted.

Even more preferably, f(t) is a substantially linear function.

The wavelength is preferably a linear function of time and it is divided in linear segments, a segment for each sub sweeping interval. Preferably, the overall number of segments can be ascending or descending (e.g., they may have all positive or all negative derivative), or preferably could be alternate (i.e. some ascending and some descending).

For example, preferably, the wavelength in each sub sweeping signal has the following form:

$\lambda_i(t)$=mt+$a_i$ where i=1 . . . N and $a_i$ is a constant sub-sweeping interval dependent.

In each other sub sweeping interval k, where k=1 . . . N with k the wavelength changes as:

$$\lambda_k(t) = mt + b_k$$

or $$\lambda_k(t) = -mt + c_k$$

where $b_k$ and $c_k$ are constants sub-sweeping interval dependent. Thus the slope m of the linear curve stays the same or becomes its opposite. The linear curves are not strictly parallel (or opposite) in the mathematical meaning of it, that is, the value m is the same in all sub-sweeping intervals not absolutely, but within a tolerance. Preferably, from one sub-sweeping interval to the other there can be a difference in the m value of maximum 20%, preferably lower than 10%, more preferably lower than 2%.

Preferably, all sub-sweeping intervals have identical sub-sweeping duration $\Delta t$ and the wavelength of the coherent light signal is a periodic function with period $\Delta t$ or 2 $\Delta t$.

The wavelength vs. time behaviour could be for example that of a sawtooth wave. In this case, between a tooth of the saw and the neighbouring one, preferably the laser is switched off. The time interval in which the laser is off corresponds to a region in the interference signal that is to be discarded.

Alternatively, it could be a triangular wave. The triangle defined by the wave is preferably isosceles.

Preferably, the method includes the step of dividing the sweeping in N sub-sweeping intervals, wherein N can range from a minimum of 2 to a maximum of 15. More preferably, N can range from a minimum of 2 to a maximum of 8. Even more preferably, N can range from a minimum of 4 to a maximum of 6. The maximum number of sub-sweeping intervals depends on what is considered to be an acceptable noise level which comes from the discontinuities in the interference signal. These discontinuities, which generally are generated in correspondence to portions of a sub sweeping intervals wherein the wavelength reaches its minimum and/or its maximum values, are preferably removed before elaborating the interference signal.

Coherent light sources with a tuning speed lower than 50 nm/μs are commercially available, showing a typical tuning range around 100 nm. In order to raise the scan speed, special optical material allow it, but they have smaller tuning ranges, typically lower than 20 nm. Therefore, the preferred number of sub sweeping intervals is a compromise between the "small-bandwidth" generally available of tunable sources and the amount of interference signal to be discarded, and it is preferably comprised between 2 and 15, more preferably between 2 and 6.

BRIEF DESCRIPTION OF THE DRAWINGS

The present invention will be better understood with non-limiting reference to the appended drawings, where:

FIG. 2 is a schematic representation of a SS-OCT system according to the invention;

FIG. 3A is a detail of the system of FIG. 2;

FIG. 4 represents as a solid line a first embodiment of a behavior of the variation of the wavelength (Δλ), expressed in nanometers, over time (t) in a light source of system of FIGS. 2 and 3A-B according to the present invention, the shown dotted line represents the signal of FIG. 1;

FIG. 5B represents the amplitude (A) in arbitrary units of the resulting interference signal over time (t), expressed in microseconds, when the signal of FIG. 4 is used to illuminate the same portion of the same sample of FIG. 5A according to the invention;

FIG. 6 represents a second embodiment of a behavior of the variation of the wavelength (Δλ), expressed in nanometers, over time (t) in a light source of system of FIGS. 2 and 3A-B according to the present invention, the shown dotted line represents the signal of FIG. 1 according to prior art;

FIG. 7A represents the amplitude (A) in arbitrary units of the resulting interference signal over time (t), expressed in microseconds, when the signal of FIG. 1 is used to illuminate a portion of a sample according to the prior art;

FIG. 9A shows the amplitude (A) in arbitrary units of the fast Fourier transform (FFT) over frequency (f) in arbitrary units for the interference signal of FIG. 8A;

DESCRIPTION OF PREFERRED DETAILED EMBODIMENTS OF THE INVENTION

Figure 1:
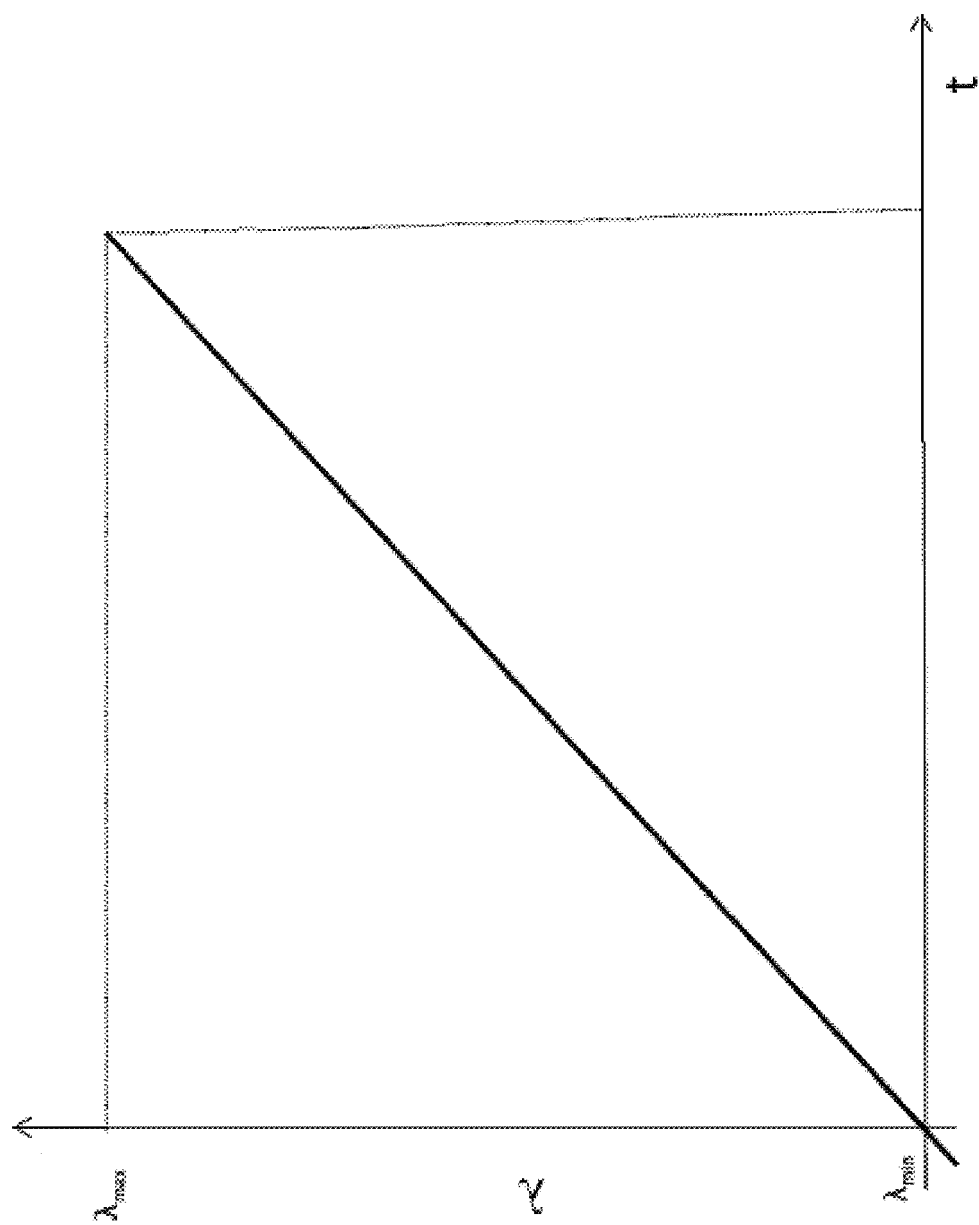
FIG. 1 represents a behavior of the variation of the wavelength (λ) over time (t) in a light source according to the prior art.

In FIG. 2, an optical coherence tomography scanner 100 for SS-OCT is illustrated. The scanner is used to illuminate a sample 110, a typical sample being tissues at the back of the human eye.

The scanner 100 includes a spatially coherent source of light, 101. This source is preferably a Swept laser Source.

Further, the scanner includes an interferometer 105, for example including two arms called reference and sample arms, 103, 104 realized with optical fibers.

Light from source 101, i.e. a coherent light signal, is routed to illuminate the sample 110 via the sample arm 104 of the interferometer 105. Further, the light from source 101 illuminates a reference reflector 106 via the reference arm 103.

The scanner 100 further includes an optical element 107 positioned between the end of the sample arm 104 and the sample 110. The optical element is able to scan light exiting the arm 104 on the sample 110, so that the beam of light (dashed line 108) sweeps over the area or volume to be imaged. This area or volume of the sample which is imaged at a given time by the optical element is called selected portion of the sample 110.

The direction of light propagation of the light towards the sample outputted from the sample arm defines a Z direction or depth. A plane perpendicular to it, where the sample lies at least partially, defines a (X, Y) plane.

Light scattered from the sample 110 is collected, typically into the same sample arm 104 used to route the light for illumination of the selected portion of the sample 110.

Reference light derived from the same source 101 travels a separate path, involving reference arm 103. The light outputted by the reference arm 103 is reflected by a reflector 106. A reflected light from the reflector is thus travelling backwards in the reference arm 103.

These two "returning" sample and reference lights back-propagating in the sample and reference arms 103, 104 are collected. Collected sample returning light is combined with collected reference returning light, typically in a fiber coupler 111, to form interference light which is routed to a detector 120, such as a photodiode. The output from the detector 120 is supplied to a processor 130. The results can be stored in the processor.

The interference causes the intensity of the interfered light to vary across the spectrum. For any scattering point in the sample, there will be a certain difference in the path length between light from the source and reflected from that point, and light from the source traveling the reference path. The interfered light has an intensity that is relatively high or low depending on whether the path length difference is an even or odd number of half-wavelengths, as these path length differences result in constructive or destructive interference respectively. Thus the intensity of the interfered light varies with wavelength in a way that reveals the path length difference; greater path length difference results in faster variation between constructive and destructive interference across the spectrum.

The Fourier transform of the interference spectrum reveals the profile of scattering intensities at different path lengths, and therefore scattering as a function of depth in the sample.

The profile of scattering as a function of depth is called an axial scan (A-scan). A set of A-Scans measured at neighbouring locations (various selected portions) in the sample produces a cross-sectional image (tomogram) of the sample.

The range of wavelengths at which the interference is recorded determines the resolution with which one can determine the depth of the scattering centers, and thus the axial resolution of the tomogram.

A more detailed view of the laser source 101 used in the scanner 100 according to the invention is depicted in FIG. 3A. The laser source, in order to tune the wavelength of the emitted signal, uses a liquid crystal 150 based etalon with a Free Spectral Range of 25 nm and a frequency response of around 10 MHz.

The laser source 101 includes a cavity 141 delimited by a first and a second mirror. The first mirror 142 is a highly reflective mirror, while the second mirror 143 is a partially transparent mirror having a mirror FSR and has the function of output coupler. The output of the etalon 150 is indicated with 146 in the figure.

The cavity further includes a gain medium or gain chip 144, pumped in a known way, and a collimating lens 145 to focus the light on the etalon 150. Etalon 150 is connected to a voltage generator 160.

The processor 130 connected to the laser changes the etalon driving voltage via the voltage generator 160 so that, during an A-scan, the wavelength of the coherent light signal emitted from the laser 101 changes according to the invention.

Figure 3B:
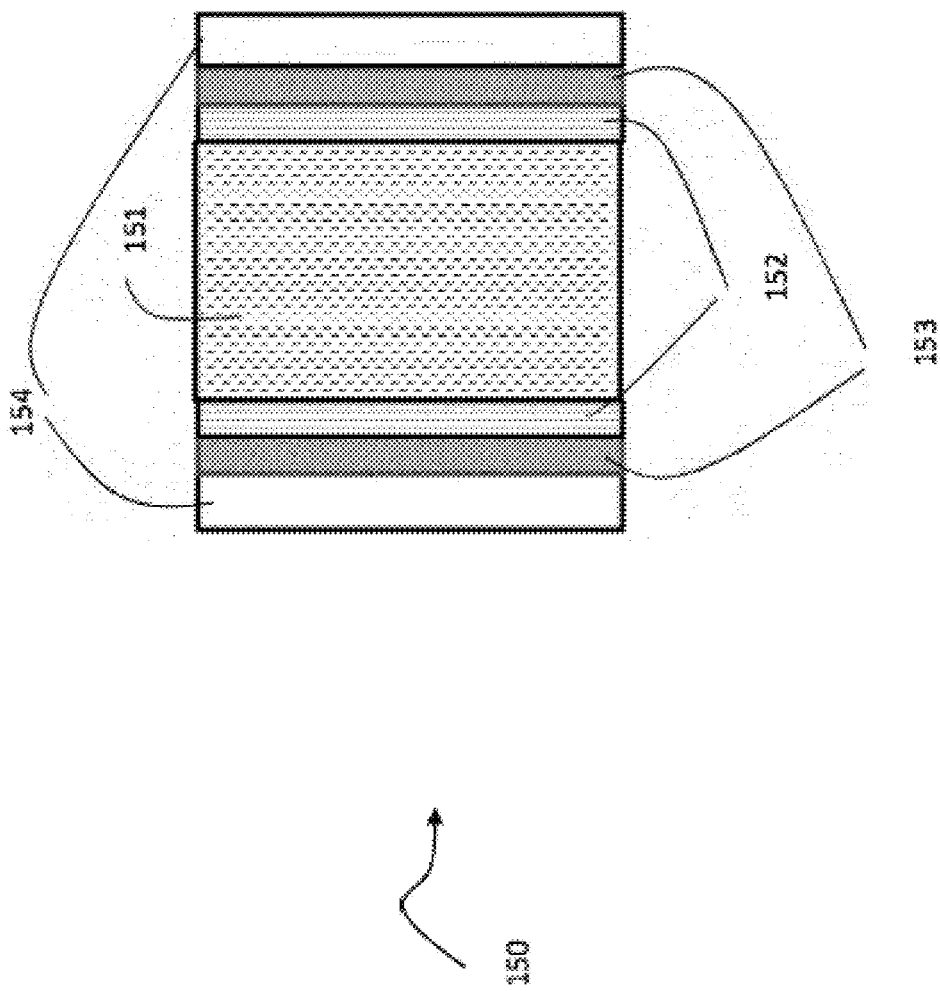
FIG. 3B is a detail in enlarged view of FIG. 3A.

In FIG. 3B, a more detailed view of the etalon 150 is shown in an enlarged view.

The etalon 150 includes a liquid crystal element 151. The liquid crystal element may include any of: CCN-47, MLC-20180, HNG715600-100 available from Nematel GmbH (Germany), Merck (USA), Jiangsu Hecheng Display technology (china), respectively.

The liquid crystal element 151 is preferably doped with a polar addictive, preferably 2, 3-dicyano-4-pentyloxyphenyl 4'-pentyloxybenzoate (DPP), CAS 67042-21-1 available from UAB Tikslioji Sinteze, Lithuania.

More information about the used liquid crystal material can be found in "Enhanced nanosecond electro-optic effect in isotropic and nematic phases of dielectrically negative nematics doped by strongly polar additive", published in Journal of Molecular Physics, December 2017, written by Bingxian Li et al.

Two opposite sides of the LC element 151 are coated with a high reflectivity dielectric multilayer 152 and the resulting structure is sandwiched between two electrodes 153 attached to the voltage generator 160. The reflectivity of the multilayer is of about 95%.

Two glass slabs 154 then closes the etalon 150.

The voltage generator applies a suitable voltage to the electrodes 153 so that the refractive index of the LC 151 changes. A linear voltage variation implies a linear change in the wavelength of the output 146. Voltage difference values applied to the electrodes vary between 0 and few kV.

In FIG. 4, a first preferred embodiment of the sweeping for an A scan which last $\Delta T$ is shown, the sweeping duration $\Delta T$ is divided is sub intervals of equal duration $\Delta t$.

In this embodiment, as visible in the figure, in each of these sub intervals of duration $\Delta t$, the wavelength of the coherent light output 146 is increased linearly and monotonously for a duration $\Delta t_A$. Further, in the same sub sweeping interval, the wavelength is decreased linearly and monotonously for a duration $\Delta t_B$ where preferably $\Delta t_B \ll \Delta t_A$. The resulting wavelength behaviour of the wavelength of the coherent light signal 146 over t is a periodic function in time with period $\Delta t = \Delta t_A + \Delta t_B$. The wavelength defines substantially, if $\Delta t_B \ll \Delta t_A$, a slightly "deformed" sawtooth function of time as represented in FIG. 4. The sawtooth scan can be made or with a very fast reset of the tuneable filter 150 if the electro-optical material is enough fast or using a beam splitter for dividing a the light source in two or more portions and an optical delay line(s) to combine said portions in a sawtooth profile line and an optical switch with the laser working in a symmetric way as in the preferred embodiment.

Therefore, the voltage difference is applied to the electrodes for a time $\Delta t$ before being switched off and starting again to be applied for another $\Delta t$. Within each $\Delta t$, the applied voltage difference varies linearly between 0 kV and 1 kV (at the maximum before being decreased again).

In FIG. 4, the prior art tuning of the wavelength is also shown (linear dashed curve equivalent to FIG. 1), where the wavelength linearly increase for the whole duration of the sweeping $\Delta T$.

Figure 5A:
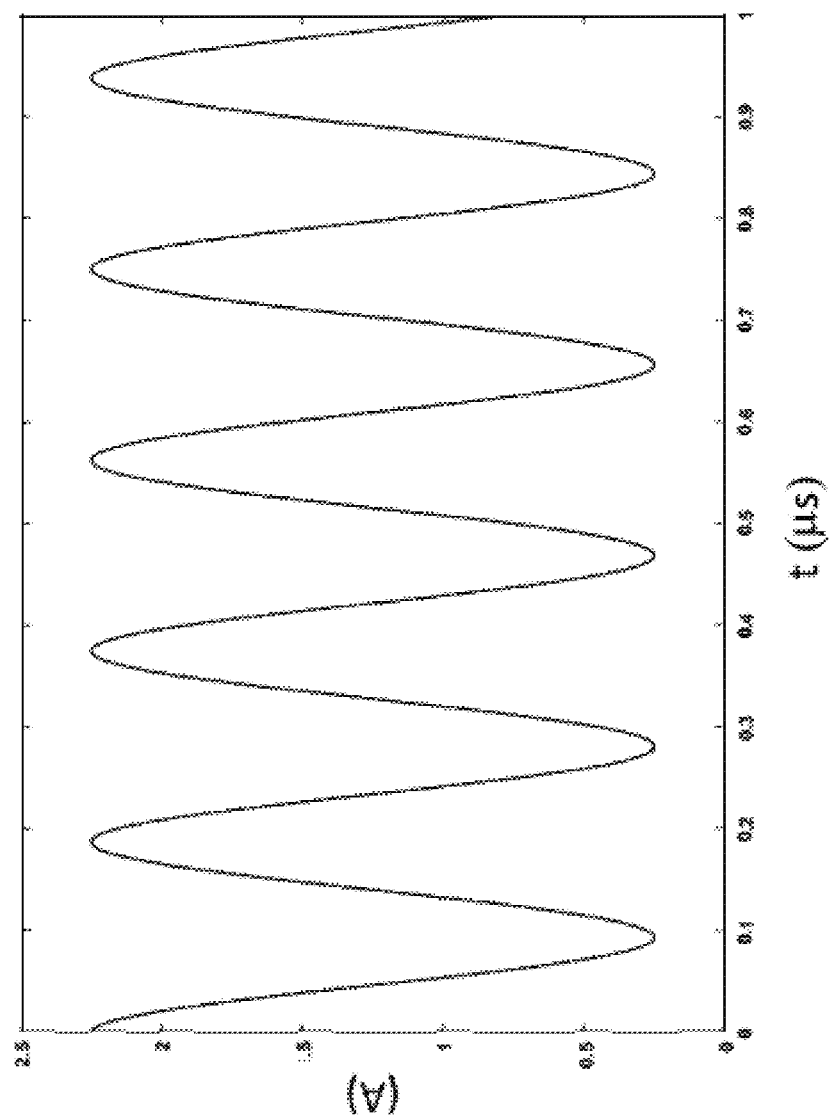
FIG. 5A represents the amplitude (A) in arbitrary units of the resulting interference signal over time (t), expressed in microseconds, when the signal of FIG. 1 is used to illuminate a portion of a sample according to the prior art.
Figure 5C:
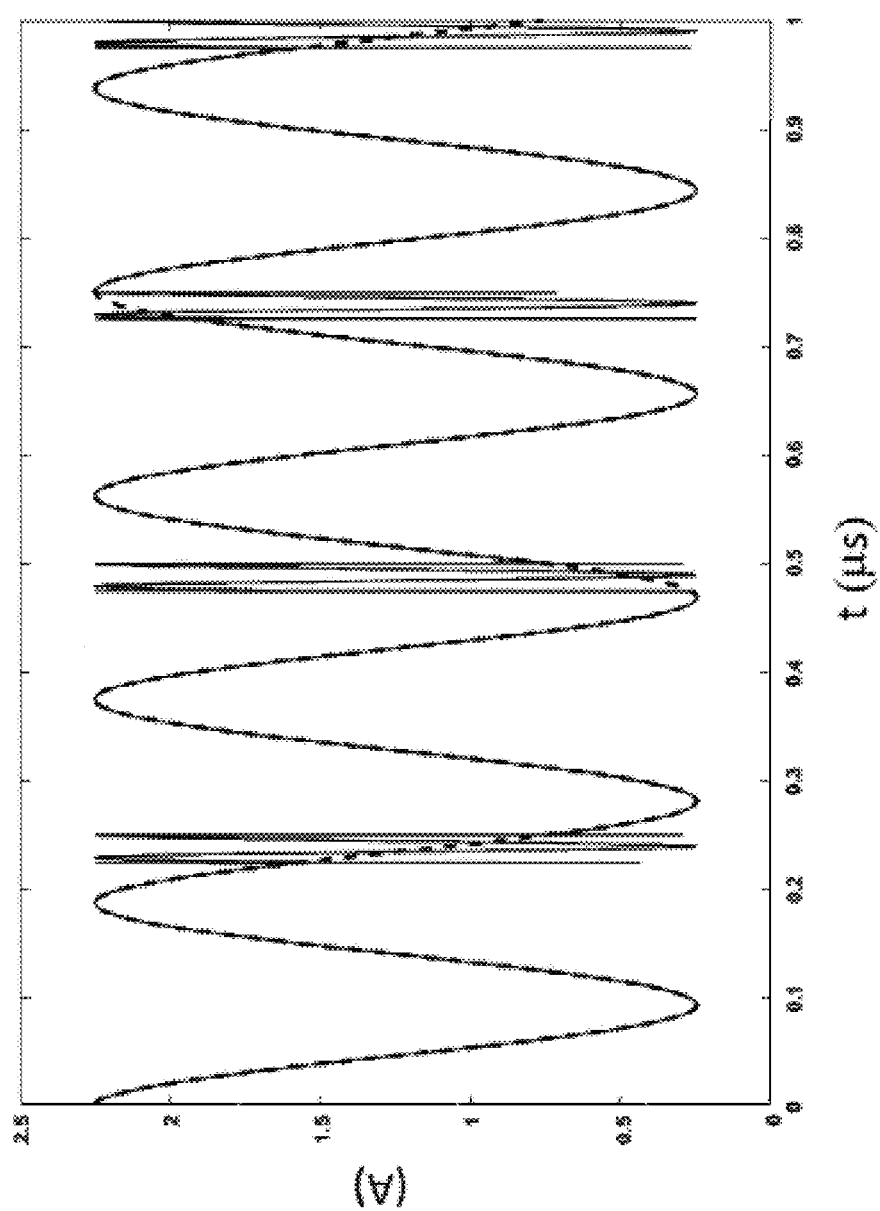
FIG. 5C represents the superposition of FIGS. 5A and 5B.

A numerical simulation of the signal from the OCT detector 120 of the interference signal obtained in case the signals (prior art and invention) of FIG. 4 is swept over the selected portion of the sample is depicted in FIGS. 5A and 5B, in the prior art result in FIG. 5A and the present invention case in FIG. 5B. Further, in FIG. 5C a superposition of the two signals is made (dashed line=prior art, solid curve=present invention).

In FIG. 5A, prior art case, the interference signal is a sinusoid.

In FIG. 5B, the interference signal shows a sinusoid and some "noise portions". It is possible to see from FIG. 5B that the interference signal in the invention presents a plurality of regions where the signal cannot be used. This portions are thus preferably discarded. These regions correspond to the portions $\Delta t_B$ of the sub sweeping intervals. However, it can also be seen that in the remaining part of the curve (i.e. outside the noise discarded portions) the signal is in perfect agreement with the prior art signal, i.e. there is substantially no difference in varying the wavelength continuously from a minimum to a "high" maximum and varying the wavelength from a minimum to a much smaller maximum and repeating this change several times. This can be clearly seen in FIG. 5C where the two signals correspond perfectly outside the "noise" portions.

It can be shown that, if $\Delta t_B$ is reduced to a minimum, the resulting portions to be discarded can be reduced as well. The smaller $\Delta t_B$ is, the smaller the part of the resulting interference signal that needs to be not considered becomes (e.g. the discarded portions become smaller).

In FIG. 6, a second preferred embodiment of the sweeping for an A scan which last $\Delta T$ is shown, the sweeping duration $\Delta T$ is divided in sub intervals of equal duration.

In each of these sub intervals of duration $\Delta t$, the wavelength is varied linearly and monotonously for the whole duration $\Delta t$. However, the variation is alternatively either increasing or decreasing. In a first sub sweeping interval, the wavelength is for example increased linearly and monotonously and in the following sub sweeping interval the wavelength is decreased linearly and monotonously. The slope of the linear curve is the same albeit opposite. In other words, if in the i-th sub-interval the slope of the segment defined by the function wavelength (t) is m, the slope of the curve in the (i+1)th sub-interval is −m.

This behaviour of the signal is obtained increasing with a certain speed the voltage applied to the electrodes 153, reaching a maximum, and then decreasing the voltage till the minimum at the same speed of the increase.

The voltage difference is applied to the electrodes for a time $2\Delta t$ before being switched off and starting again to be applied for another $2\Delta t$. Within each $\Delta t$, the applied voltage difference varies linearly between 0 kV and 1 kV and then from 1 kV to 0 kV.

In FIG. 6, the prior art tuning of the wavelength is also shown (linear dashed curve equivalent to FIG. 1), where the wavelength linearly increase for the whole duration of the sweeping $\Delta T$.

Figure 7B:
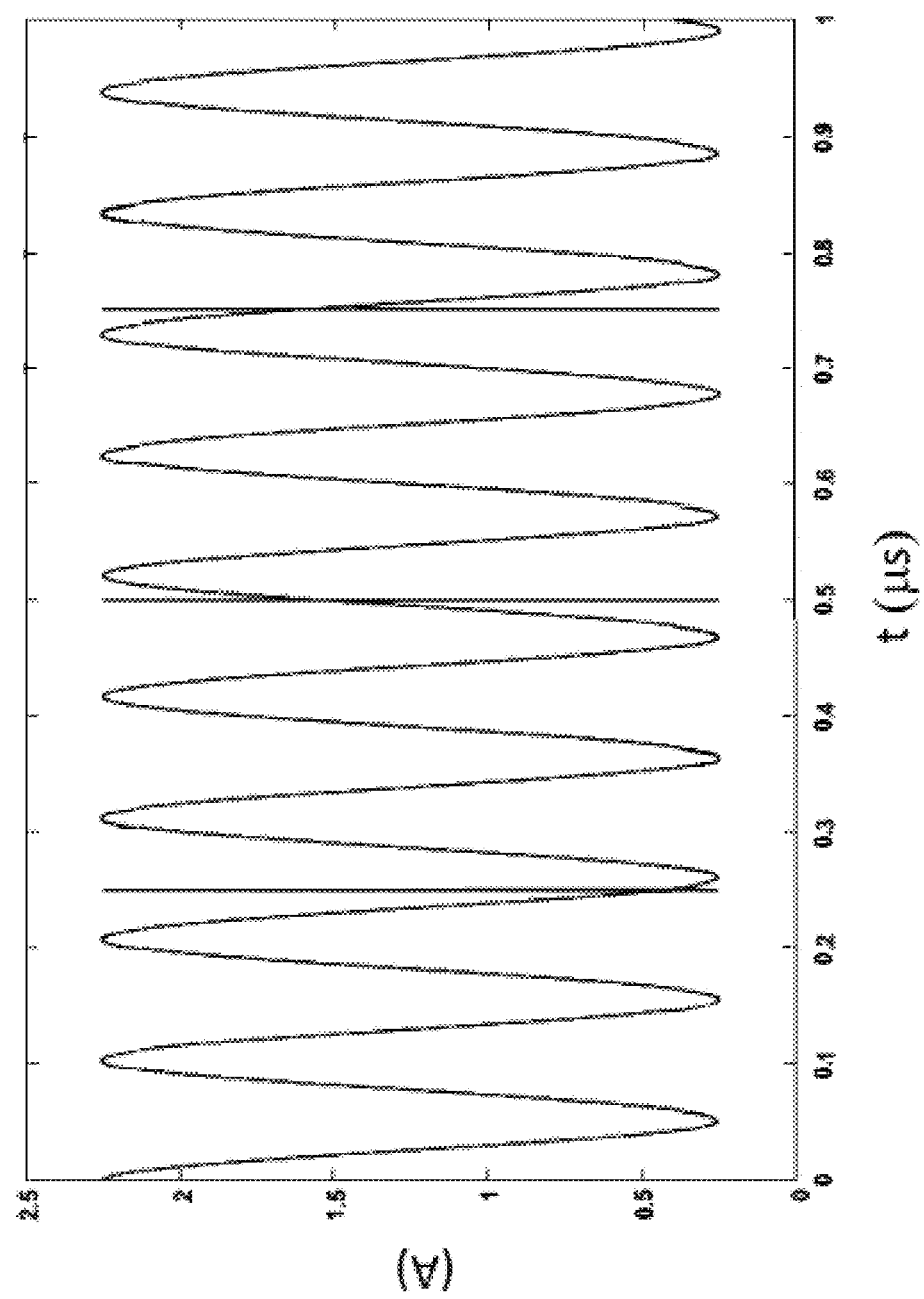
FIG. 7B represents the amplitude (A) in arbitrary units of the resulting interference signal over time (t), expressed in microseconds, when the signal of FIG. 6 is used to illuminate the same portion of the same sample of FIG. 7A according to the invention.
Figure 7C:
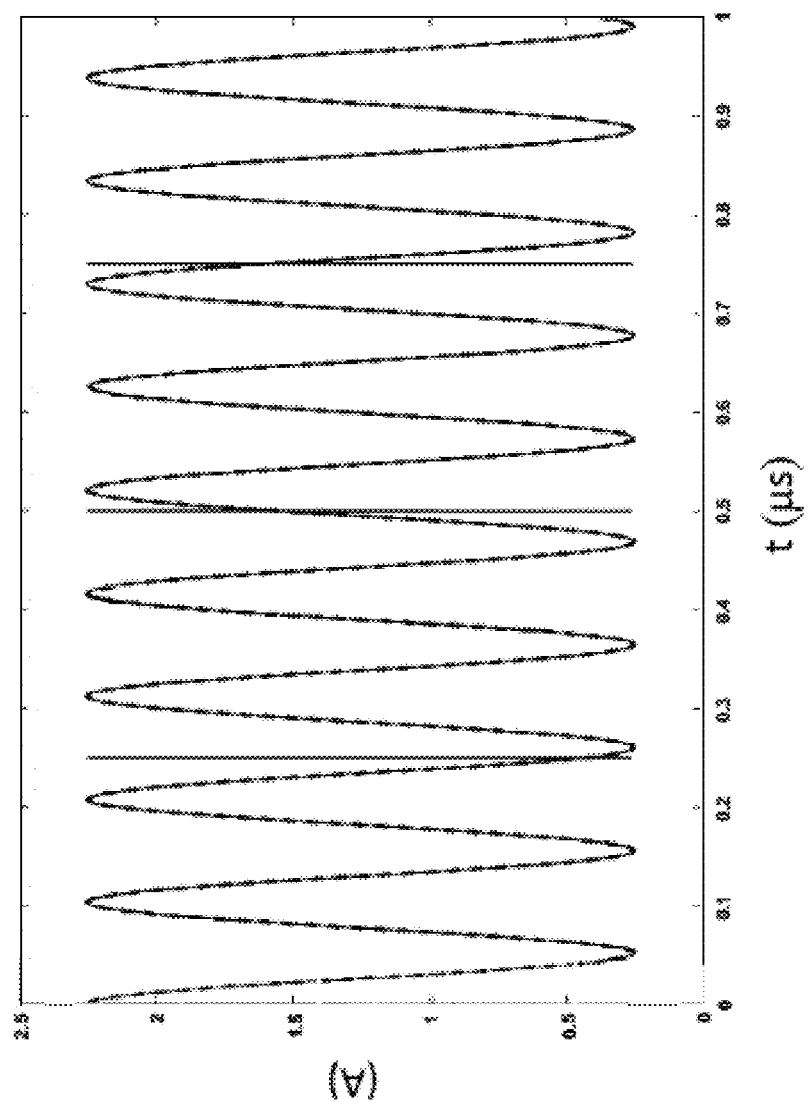
FIG. 7C represents the superposition of FIGS. 7A and 7B.

A numerical simulation of the signal from the OCT detector 120 of the interference signal obtained in case the signals (prior art and invention) of FIG. 6 is swept over the selected portion of the sample is depicted in FIGS. 7A and 7B. The prior art results are shown in FIG. 7A and the present invention case in FIG. 7B. Further, in FIG. 7C a superposition of the two signals is made (dashed line=prior art, solid curve=present invention).

In FIG. 7A, prior art case, the interference signal is a sinusoid.

In FIG. 7B, the interference signal shows a sinusoid and some "noise portions". It is possible to see from FIG. 7B that the interference signal in the invention presents a plurality of regions where the signal cannot be used. These regions correspond to the boundary between one sub sweeping interval and the next sub sweeping interval. They also correspond to the point in which the wavelength changes behavior, from increasing to decreasing. However, it can also be seen that in the remaining part of the curve (i.e. outside the discarded portions) the signal is in perfect agreement with the prior art signal, i.e. there is substantially no difference in varying the wavelength continuously from a minimum to a "high" maximum and varying the wavelength from a minimum to maximum and from the maximum to the same minimum, repeating this change several times. This can be clearly seen in FIG. 7C where the two signals correspond perfectly outside the "noise" regions.

Figure 8A:
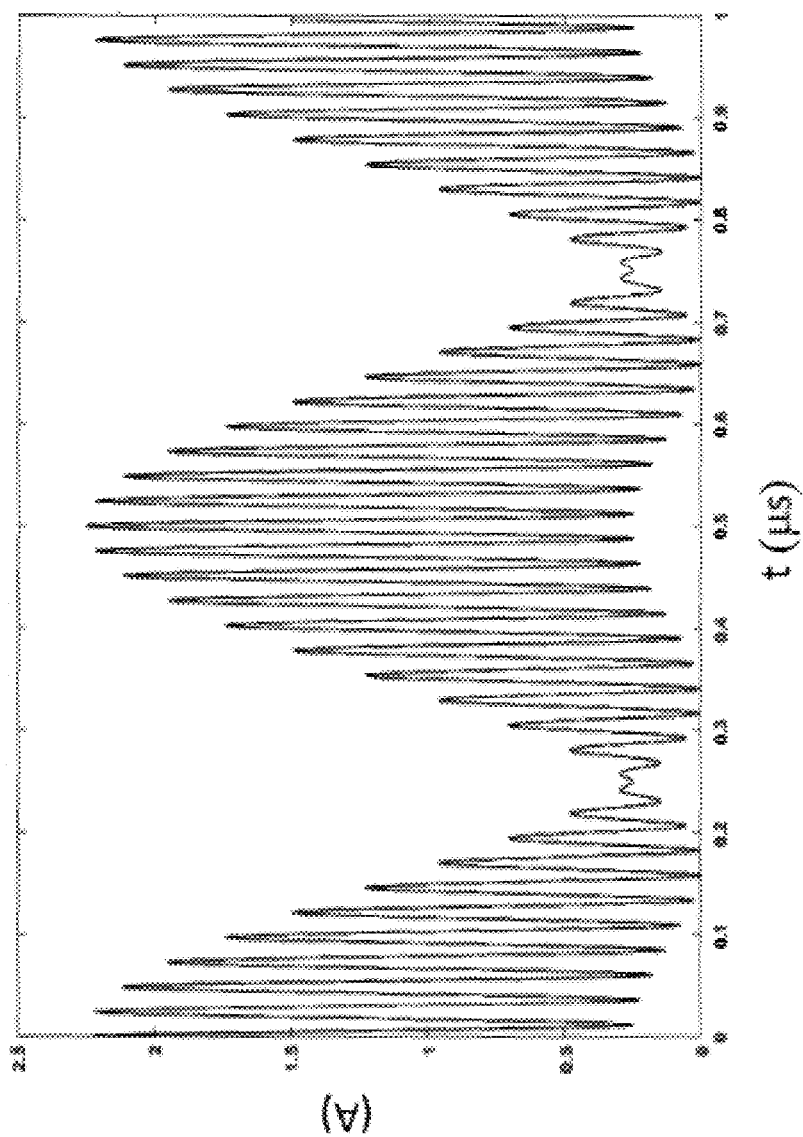
FIG. 8A represents the amplitude (A) in arbitrary units of the resulting interference signal over time (t), expressed in microseconds, when the signal of FIG. 1 is used to illuminate a portion of a sample according to the invention, where two reflections are present.
Figure 8B:
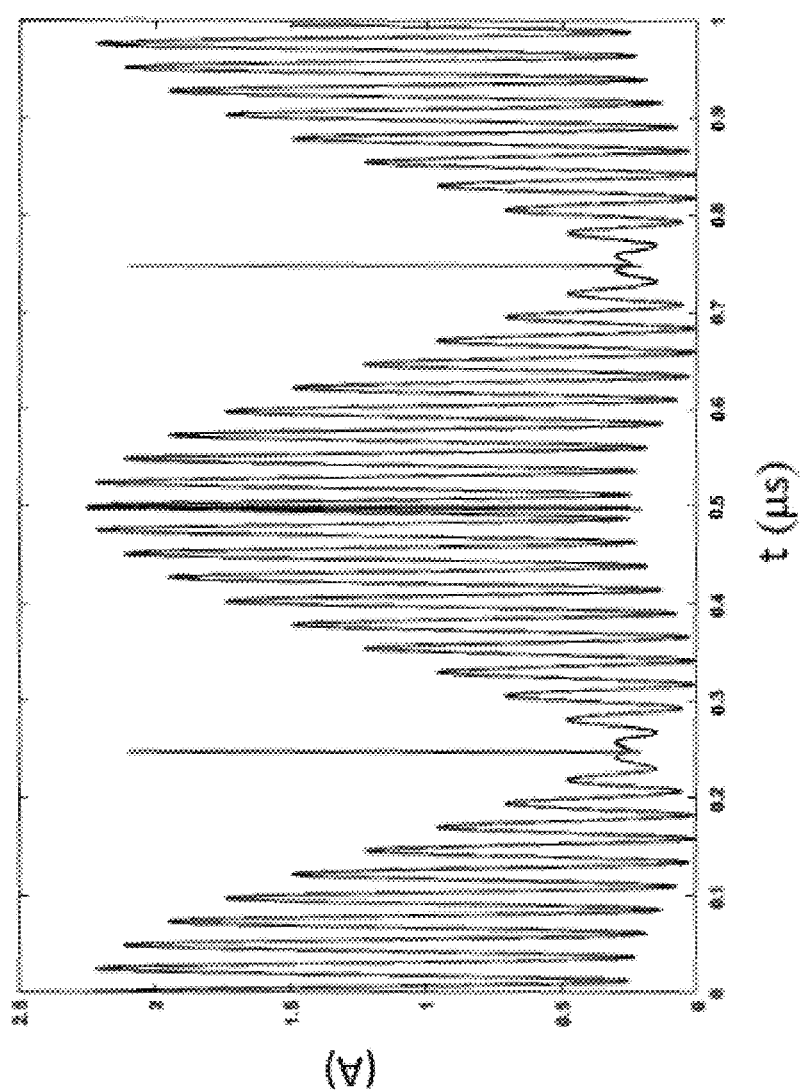
FIG. 8B represents the amplitude (A) in arbitrary units of the resulting interference signal over time (t), expressed in microseconds, when the signal of FIG. 6 is used to illuminate the same portion of the same sample of FIG. 8A according to the invention.
Figure 8C:
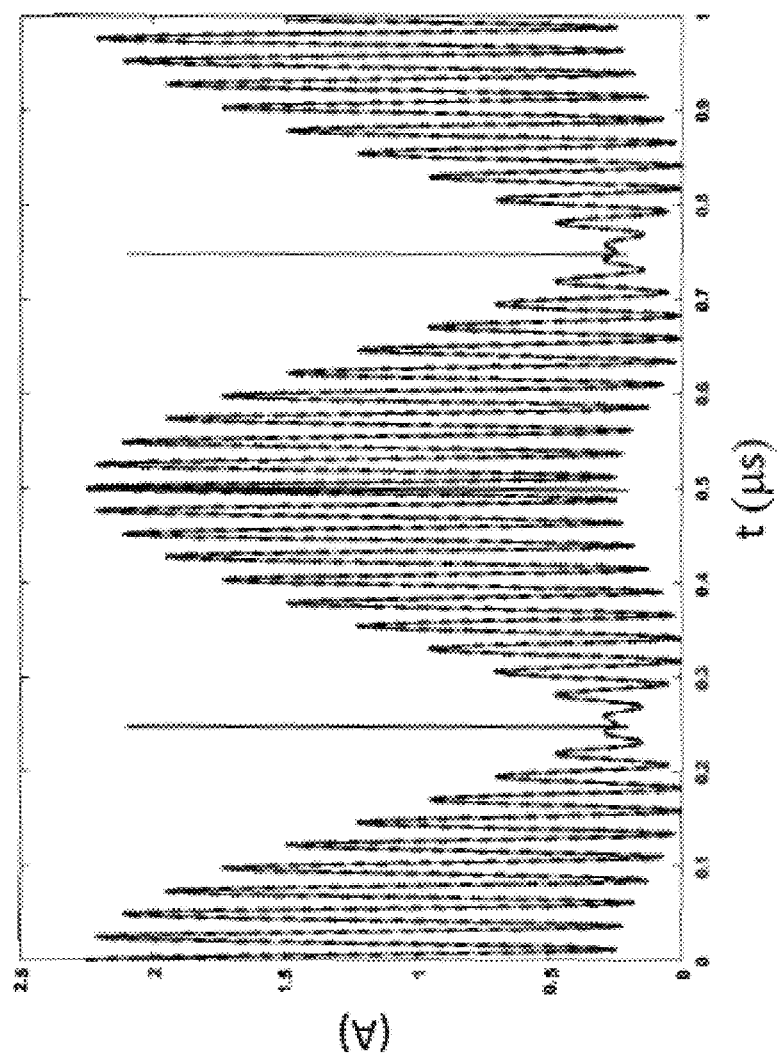
FIG. 8C represents the superposition of FIGS. 8A and 8B.

FIG. 8A-8C show the simulations results using the second embodiment sweeping signal of FIG. 6, however in this case two reflections separated by 10 μm are present in the sample.

A numerical simulation of the signal from the OCT detector 120 of the interference signal obtained in case the signals (prior art and invention) of FIG. 6 is swept over the selected portion of the sample is depicted in FIGS. 8A and 8B. The prior art result are shown in FIG. 8A and the present invention case in FIG. 8B.

Further, in FIG. 8C a superposition of the two signals is made (dashed line=prior art, solid curve=present invention).

In FIG. 8A, prior art case, the interference signal is a superposition of two sinusoids having different frequency. Each frequency represents a different reflection on the sample.

In FIG. 8B, the interference signal shows also two sinusoids superimposed, and some "noise portions". It is possible to see from FIG. 8B that the interference signal in the invention presents a plurality of regions where the signal cannot be used. These regions correspond to the boundary between one sub sweeping interval and the next sub sweeping interval. They also correspond to the point in which the wavelength changes behavior, from increasing to decreasing. However, it can also be seen that in the remaining part of the curve (i.e. outside the noise discarded portions) the signal is in perfect agreement with the prior art signal, i.e. there is substantially no difference in varying the wavelength continuously from a minimum to a "high" maximum and varying the wavelength from a minimum to maximum and from the maximum to the same minimum, repeating this change several times. This can be clearly seen in FIG. 8C where the two signals correspond perfectly outside the "noise" regions.

Figure 9B:
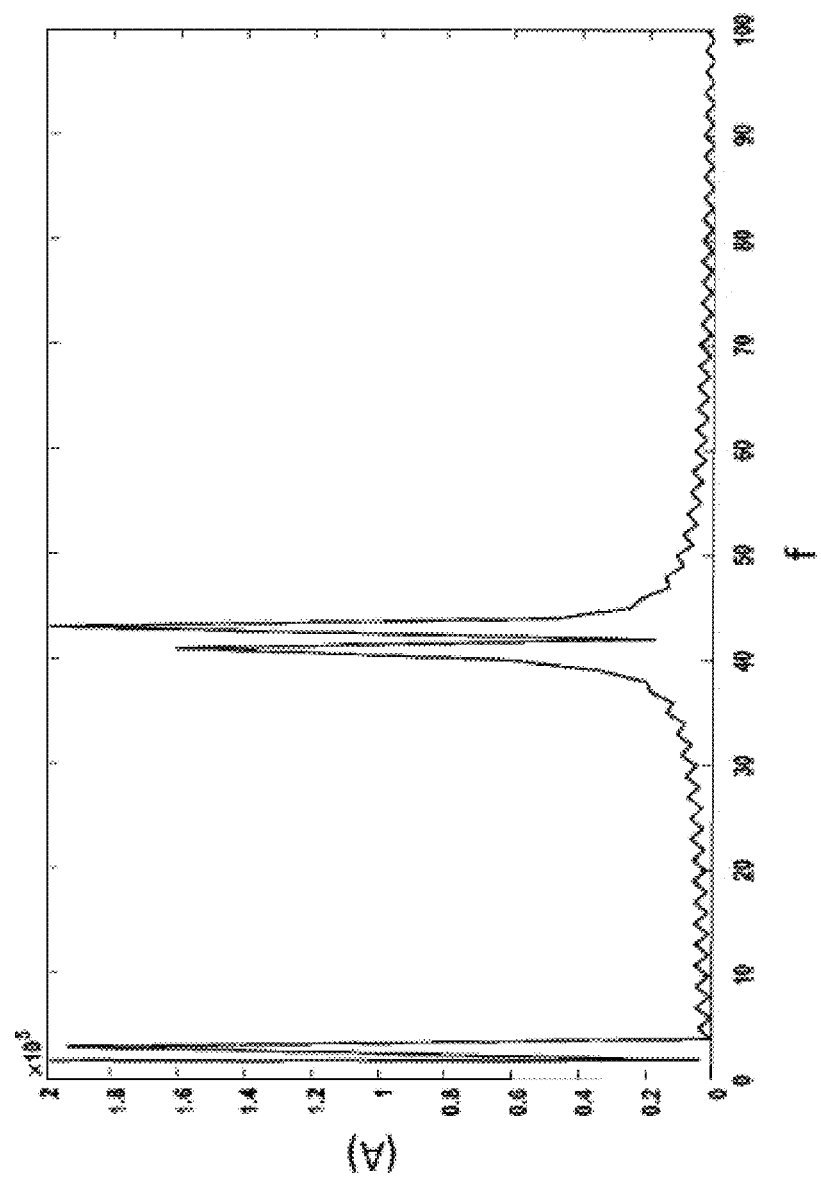
FIG. 9B shows the amplitude (A) in arbitrary units of the fast Fourier transform (FFT) over frequency (f) in arbitrary units for the interference signal of FIG. 8B.
Figure 9C:
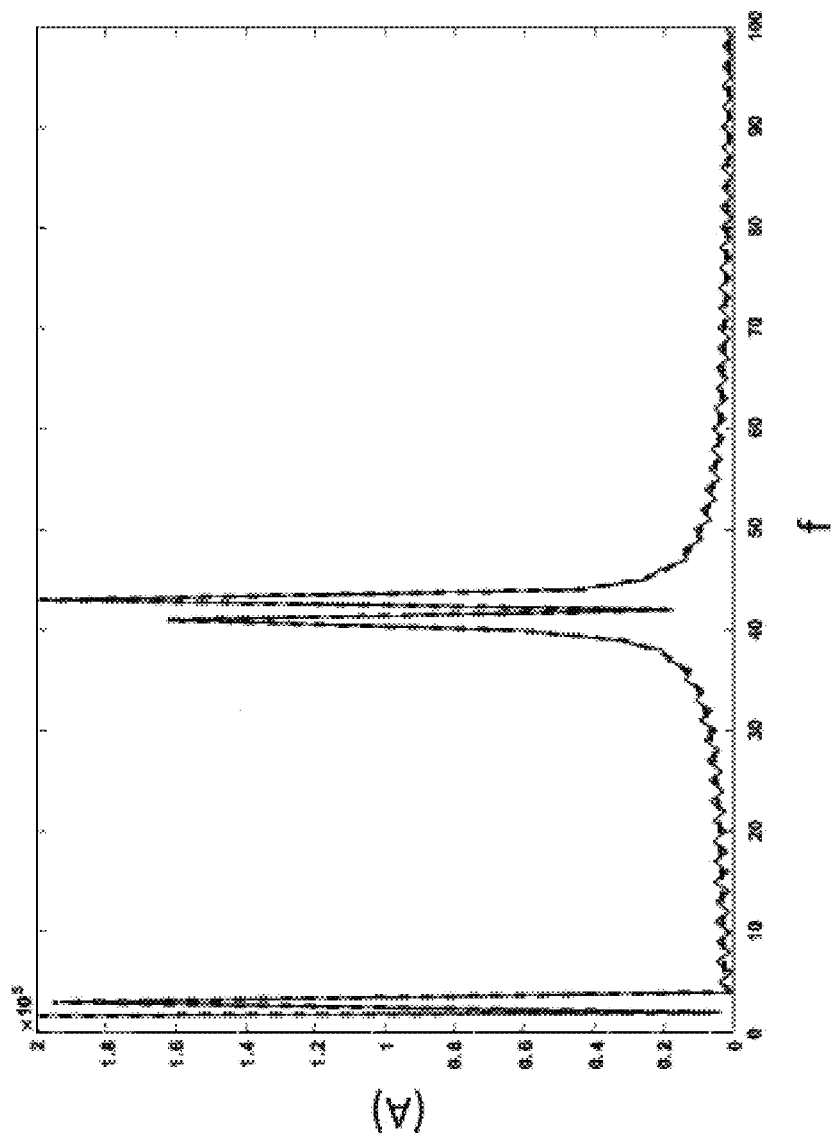
FIG. 9C shows the superposition of FIGS. 9A and 9B.

FIG. 9A-9C show the fast Fourier transform (FFT) for this interference signal of FIG. 8A-8C (respectively) where the two reflections can be clearly distinguished. In the two cases of prior art and present invention. It is possible to see that the two spectral behaviors are very similar with only a small added noise for the present invention case.

EXAMPLES

The laser can emit light at 1550 nm using InP based gain chip. The emission wavelength change by tuning the intra cavity tunable filter at different transmission wavelength by varying the voltage applied to the electro-optical material (in our case a thin liquid Chrystal film inside a Fabry-Perot cavity). The output of the laser is coupled at the input of an interferometer (a 2×2 in fiber coupler). At the other input arm is coupled a fast photodiode (bandwidth around 1 GHz) connected with a signal processor. At the end of one of the output arms is fixed the reference mirror and at the other output arm the scanning element based on a collimating lens and a scanning mirror. The length of the two output arms is preferably balanced for optimum interferometer work.

The sweeping time is set to be equal to 1 μs and it is divided in N=4 sub sweeping interval, each of 250 ns.

What is called "prior art" signal is substantially the sweeping of FIG. 1, obtained maintaining the laser source sweeping for 1 us covering 100 nm.

The signal as depicted in FIG. 6 is obtained sweeping the laser for 250 ns increasing the output wavelength of 25 nm than inverting the sweep for other 250 nm returning at the initial wavelength and then we repeat the previous two sweeps a second time. During this 1 μs (4×250 ns) the optical element of the OCT remain fixed on the same measurement point.

The signal of FIG. 4 is obtained sweeping the output wavelength linearly for 225 ns at a slightly higher speed covering 25 nm than reset in 25 ns and repeat four time this cycle (see FIG. 4). As in the previous example during this 1 μs (4×250 ns) the optical element of the OCT remain fixed on the same measurement point.

The electrical signal from the photodiode is then amplified and sampled (in the example 10 sample per ns). The resulting 10000 samples are then Fourier transformed using a Cooley-Tukey Fast Fourier Transform (FFT) algorithm.

The structure of the tunable optical filter or etalon 150 is the following:

Glass 154: each glass slab has a thickness smaller than 1 mm, preferably smaller than 0.75 mm;

ITO 153: each electrode has a thickness smaller than 100 nm, preferably smaller than 50 nm;

High reflectivity dielectric multilayer 152: it has a thickness comprised in the range between 0.5 μm and 5 μm as a function of desired reflectivity;

Liquid crystal 151: it has a thickness smaller than 100 μm, preferably smaller than 50 μm, more preferably smaller than 30 μm (the free spectral range is affected by the thickness choice, which is in turn affected by liquid crystal characteristics as refractive index, induce birefringency, and externally applied electro-magnetic field).

The invention claimed is:

1. A method to tune a wavelength of a coherent light signal emitted by a tunable laser, the tunable laser comprising:
   a cavity, the cavity including:
      a gain medium,
      an optical tunable filter,
      a first and a second mirrors, one of which is partially reflective, wherein:
   the first mirror is partially reflective and the second mirror is substantially totally reflective;

the first mirror defines a mirror free spectral range and the optical tunable filter defines a filter free spectral range; and the mirror free spectral range is of the same order of magnitude of the filter free spectral range; and wherein the optical tunable filter includes:
a first and a second electrodes,
a liquid crystal, the method comprising:
applying a voltage difference between the first and second electrodes to apply an electric field to the liquid crystal;
wherein applying a voltage difference includes:
applying the voltage difference for at least a driving time interval lasting less than 1 µs; and
varying the voltage difference applied between the first and second electrodes within the driving time interval so that a maximum applied voltage difference is reached and said maximum applied voltage is above 0.1 kV.

2. Method or tunable laser according to claim 1, wherein applying a voltage difference includes applying the voltage difference for at least a driving time interval lasting between 1 ns and 1 µs.

3. Method or tunable laser according to claim 1 wherein the liquid crystal comprises a nematic liquid crystal.

4. Method or tunable laser according to claim 1, wherein the liquid crystal or the nematic liquid crystal is doped with polar additive.

5. Method or tunable laser according to claim 4, wherein the polar addictive has a negative dielectric anisotropy.

6. Method or tunable laser according to claim 1, wherein varying the voltage difference applied to the first and second electrodes within a driving time interval includes varying the voltage difference between a minimum and a maximum.

7. Method or tunable laser according to claim 6, wherein varying the voltage difference applied to the first and second electrodes within a driving time interval includes:
varying the voltage difference between a minimum value to a maximum value; and
varying the voltage difference between the maximum value to the minimum value afterwards.

8. Method or tunable laser according to claim 6, wherein varying the voltage applied to the first and second electrodes within a driving time interval includes:
varying the voltage difference between a minimum value to a maximum value;
interrupting the voltage difference application.

9. Method or tunable laser according to claim 1, wherein the applied voltage difference has a repetition rate comprised between 100 kHz and 100 Mhz.

10. Method or tunable laser according to claim 1, wherein the optical tunable filter further comprises a first and a second dielectric layer sandwiching the liquid crystal.

11. Method or tunable laser according to claim 10, wherein the first and/or second dielectric layer defines a reflectivity, the reflectivity being above or equal to 95%.

12. Method or tunable laser according to claim 1, wherein the liquid crystal defines a liquid crystal thickness, and wherein a distance between the first and second electrodes is comprised between 10 micron and 200 micron.

13. Method or tunable laser according to claim 1, wherein the first and the second electrodes are at least partially transparent to a radiation having a given wavelength resonating in the cavity.

14. Method or tunable laser according to claim 1, wherein the filter free spectral range and/or the mirror free spectral range is >20 nm.

15. A tunable laser comprising:
a cavity, the cavity including:
a gain medium,
an optical tunable filter,
a first and a second mirrors, one of which is partially reflective, wherein:
the first mirror is partially reflective and the second mirror is substantially totally reflective;
the first mirror defines a mirror free spectral range and the optical tunable filter defines a filter free spectral range; and
the mirror free spectral range is of the same order of magnitude of the filter free spectral range; and
wherein the optical tunable filter includes:
a first and a second electrodes,
a liquid crystal, the liquid crystal being subject to an electric field created by the first and second electrodes, and
a voltage generator to apply a voltage difference between the first and second electrodes, said voltage generator being programmed for:
applying the voltage difference for at least a driving time interval lasting less than 1 µs; and
varying the voltage difference applied between the first and second electrodes within the driving time interval so that a maximum applied voltage difference is reached and said maximum applied voltage is above 0.1 kV.

16. An Optical Coherence Tomography (OCT) system including:
the tunable laser according to claim 15, emitting a coherent light signal;
an optical interferometer for dividing the coherent light signal into a reference arm leading to a reference reflector and a sample arm leading to a sample;
an optical element to selectively direct a sample light signal exiting the sample arm to a specific portion of the sample, so that for each selection in the optical element a different specific portion of the sample is illuminated;
an optical detector for detecting an interference signal generated by a combination of reference and sample returning signals from the reference arm and from the sample arm, reflected by the reference reflector and the sample, respectively.

17. The OCT system according to claim 16, further including:
a processing unit, said processing unit being programmed for, for the same selection in the optical element illuminating a specific portion of the sample:
i defining a sweeping time interval $\Delta T$;
ii changing the coherent light signal leading to the sample light signal illuminating the specific portion of the sample from a minimum wavelength to a maximum wavelength and in the same sweeping modifying the wavelength of the coherent light signal so that it reaches the same value between the minimum wavelength to the maximum wavelength at least twice during the sweeping;
iii elaborating the detected interference signal for obtaining an OCT image of the specific portion of the sample.

18. An optical coherence tomography analysis method, comprising:
- providing an Optical Coherence Tomography system according to claim 16, wherein the method further comprises:
- sweeping the tunable laser for a time interval ΔT, so that a wavelength of the coherent light signal leading to the sample light signal illuminating the specific portion of the sample changes from a minimum wavelength to a maximum wavelength, wherein said sweeping includes:
  - applying a voltage difference between the first and second electrodes to apply an electric field to the liquid crystal to change a refractive index of the liquid crystal by NEMOP (nanosecond electric modification of order parameter) effect; wherein applying a voltage difference includes:
    - applying the voltage difference for at least a driving time interval lasting less than 1 µs; and
    - varying the voltage difference applied between the first and second electrodes within the driving time interval so that a maximum applied voltage difference is reached and said maximum applied voltage is above 0.1 kV;
- detecting the interference signal generated by the sweeping;
- elaborating the detected interference signal generated by the sweeping to obtain an OCT image of the specific portion of the sample.

19. A method to tune a wavelength of a coherent light signal emitted by a tunable laser, the tunable laser comprising:
- a cavity, the cavity including:
  - a gain medium,
  - an optical tunable filter,
  - a first and a second mirrors, one of which is partially reflective, wherein the optical tunable filter includes:
  - a first and a second electrodes,
  - a liquid crystal, the method comprising:
- applying a voltage difference between the first and second electrodes to apply an electric field to the liquid crystal;
- wherein applying a voltage difference includes:
  - applying the voltage difference for at least a driving time interval lasting less than 1 µs; and
  - varying the voltage difference applied between the first and second electrodes within the driving time interval so that a maximum applied voltage difference is reached and said maximum applied voltage is above 0.1 kV, wherein varying the voltage difference applied to the first and second electrodes within a driving time interval includes varying the voltage difference between a minimum and a maximum and wherein varying the voltage difference applied to the first and second electrodes within a driving time interval includes varying the voltage difference linearly with time.

* * * * *